United States Patent [19]

Wada et al.

[11] Patent Number: 5,379,248

[45] Date of Patent: Jan. 3, 1995

[54] SEMICONDUCTOR MEMORY DEVICE

[75] Inventors: Tomohisa Wada; Kenji Anami; Shuji Murakami, all of Hyogo, Japan

[73] Assignee: Mitsubishi Denki Kabushiki Kaisha, Tokyo, Japan

[21] Appl. No.: 181,524

[22] Filed: Jan. 13, 1994

Related U.S. Application Data

[62] Division of Ser. No. 725,782, Jul. 9, 1991, Pat. No. 5,280,441.

[30] Foreign Application Priority Data

Jul. 10, 1990 [JP] Japan .................................. 2-183572
Jun. 15, 1991 [JP] Japan .................................. 3-143707

[51] Int. Cl.[6] .............................................. G11C 5/06
[52] U.S. Cl. .......................................... 365/63; 365/51
[58] Field of Search .................... 365/63, 51, 230.03, 365/230.06, 189.01, 203

[56] References Cited

U.S. PATENT DOCUMENTS

| | | | |
|---|---|---|---|
| 4,367,540 | 1/1983 | Shimohigashi | 365/207 |
| 4,418,399 | 11/1983 | Sakurai | 365/51 |
| 4,542,486 | 9/1985 | Anami et al. | 365/189 |
| 4,748,591 | 5/1988 | Itoh et al. | 365/51 |
| 4,829,484 | 5/1989 | Arimoto et al. | 365/222 |
| 4,866,676 | 9/1989 | Crisp et al. | 365/51 |
| 4,896,294 | 1/1990 | Shimizu et al. | 365/149 |
| 4,926,385 | 5/1990 | Fujishima et al. | 365/230.03 |
| 4,958,316 | 9/1990 | Ochii et al. | 365/51 |
| 4,985,867 | 1/1991 | Ishii et al. | 365/221 |
| 5,014,241 | 5/1991 | Asakura et al. | 365/51 |
| 5,091,887 | 2/1992 | Asakura | 365/206 |

OTHER PUBLICATIONS

Y. Kohno et al., "A 14-ns 1-Mbit CMOS SRAM with Variable Bit Organization", IEEE Journal of Solid State Circuits, vol. 23, No. 5, Oct. 1988, pp. 1060–1066.

T. Wada et al., "A 34-ns 1-Mbit CMOS SRAM Using Triple Polisilicon", IEEE Journal of Solid-State Circuits, vol. 22, No. 5, Oct. 1987, pp. 727–732.

M. Yoshimoto et al., "A Divided Word-Line Structure in the State RAM and its Application to a 64K Full CMOS RAM", IEEE Journal of Solid-State Circuit, vol. SC-18, Oct. 1983, pp. 479–485.

T. Hirose et al., "A 20ms 4Mb CMOS SRAM with Hierarchical Word Decoding Architecture", 1990 IEEE International Solid-State Circuit Conference, Feb. 15, 1990.

K. Itoh, "Trends in Megabit DRAM Circuit Design", IEEE Journal of Solid-State Circuits, vol. 25, No. 3, Jun. 1990, pp. 778–789.

*Primary Examiner*—Eugene R. LaRoche
*Assistant Examiner*—A. Zarabian
*Attorney, Agent, or Firm*—Lowe, Price, LeBlanc & Becker

[57] ABSTRACT

A plurality of bit line signal IO lines L1, /L1 ... Ln and /Ln are arranged on a memory cell array. These bit line signal IO lines are arranged to cross respective bit lines BL1, /BL1, ... BLn and /BLn, and are connected to the corresponding bit lines, respectively. Each bit line signal IO line has an end extended to an end, in a direction perpendicular to the bit line, of a memory cell array, and is coupled at the end to a bit line peripheral circuit. Although bit line peripheral circuits could be arranged only at upper and lower ends of the bit lines in the prior art, the bit line peripheral circuits can be arranged also at the ends of the bit line signal IO lines in the invention. This can increase a degree of freedom in a layout for the bit line peripheral circuits, and thus the bit line peripheral circuits can be dispersedly arranged in a larger area.

25 Claims, 44 Drawing Sheets

F I G. 37
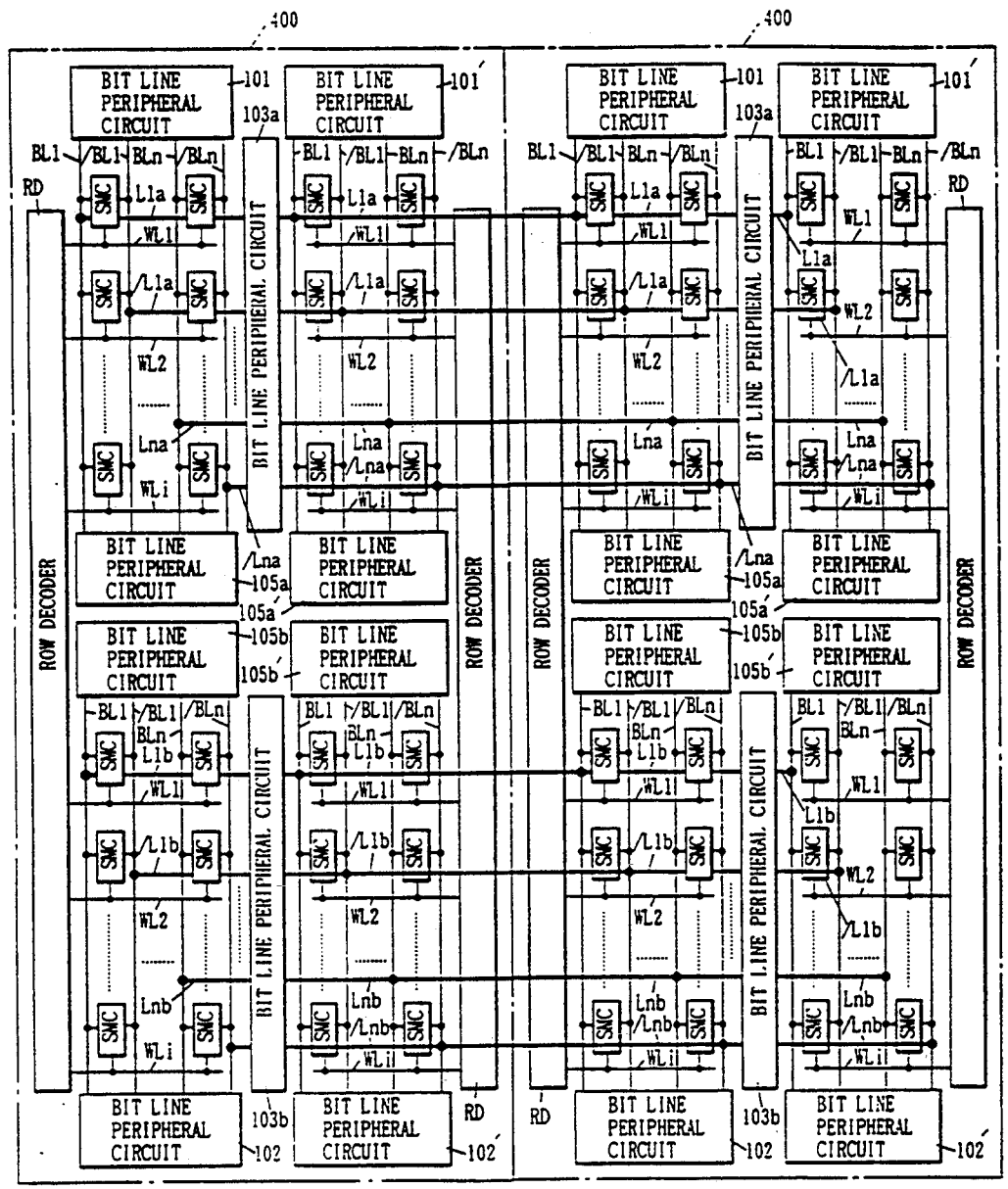

SEMICONDUCTOR MEMORY DEVICE

This application is a division of application Ser. No. 07/725,782 filed Jul. 9, 1991, now U.S. Pat. No. 5,280,441, issued Jan. 18, 1994.

BACKGROUND OF THE INVENTION

1. Field of the Invention

The present invention relates to a semiconductor memory device, and particularly to an improved semiconductor memory device having bit lines for inputting and outputting data for memory cells.

2. Description of the Prior Art

FIG. 45 is a block diagram illustrating an example of a conventional static RAM (referred to as "SRAM" hereinafter). In FIG. 45, a row address input terminal group 1 receives external row address data, and the inputted row address data is amplified or inverted by a row address buffer 2 and is applied to a row decoder 3. The row decoder 3 decodes the row address data applied through the input terminal group 1.

On the other hand, a column address input terminal group 4 receives external column address data, and the inputted column address data is amplified or inverted by a column address buffer 5 and is applied to a column decoder 6. The column decoder decodes the column address data applied through the input terminal group 4. A memory cell array 7 includes a plurality of memory cells arranged in a matrix, for storing information. A read voltage of a small amplitude read from the memory cell array 7 is applied through a multiplexer 8 to a sense amplifier 9 to be amplified therein. An output from the sense amplifier 9 is further amplified by an output data buffer 10 to a level required for fetching it externally from the semiconductor memory device, and is externally outputted through a read data output terminal 11.

A write data input terminal 12 receives write data. The write data thus applied is amplified by an input data buffer 13. A chip selection signal is applied to a terminal 14, and a read/write control signal is applied to a terminal 15. A read/write control circuit 16 controls the sense amplifier 9, output data buffer 10 and input data buffer 13 in accordance with selection/non-selection of the chip and read/write modes of the data, which are determined by the chip selection signal and the read/write control signals, respectively.

FIG. 46 shows peripheral structures of the memory cell array 7 in the SRAM shown in FIG. 45. In FIG. 46, for simplicity reasons, the memory cell array 7 is shown in a form of two rows by two columns. Referring to FIG. 46, memory cells 24a–24d are disposed at crossings if a bit line pair 20a and 20b and a bit line pair 21a and 21b, and word lines 22 and 23 connected to output terminals of the row decoder 3, respectively. Bit line loads 25a, 25b, 26a and 26b are disposed at ends of the bit lines 20a, 20b, 21a and 21b, respectively. These bit line loads 25a, 25a, 26a and 26b are formed of transistors which have first conductive terminals and gates connected to a power supply 18 and second conductive terminals connected to the corresponding bit lines.

The multiplexer 8 shown in FIG. 45 includes transfer gates 27a, 27b, 28a and 28b which are disposed at the other end of each of the bit lines 20a, 20b, 21a and 21b, respectively. Each of the transfer gates has a gate to which an output signal from the column decoder 6 shown in FIG. 45 is applied, its drain/source connected to a corresponding bit line and its source/drain connected to a corresponding input/output (IO) line of an IO line pair 29a and 29b. A potential difference between the IO lines 29a and 29b is sensed by the sense amplifier 9. An output from the sense amplifier 9 is amplified by the output buffer 10.

Each memory cell 24 in FIG. 46 may be in a form of a MOS memory cell of a high resistance load type shown in FIG. 47 or a CMOS memory cell shown in FIG. 48.

The memory cell shown in FIG. 47 includes driver transistors 41a and 41b. The transistor 41a has its drain connected to a memory node 45a, its gate connected to a storage node 45b and its source grounded. The transistor 41b has its drain connected to a storage node 45b, its gate connected to a storage node 45a and its source grounded. The memory cell 24 further includes access transistors 42a and 42b. The transistor 42a has its drain or source connected to the storage node 45a, its gate connected to a word line 22 or 23 and its source or drain connected to a bit line 20a or 21a. The transistor 42b has its drain or source connected to the storage node 45b, its gate connected to a word line 22 or 23 and its source or drain connected to a bit line 20b or 21b. The memory cell 24 also includes load resistances 43a and 43b, which are connected at ends to the power supply 18 and at other ends to the storage nodes 45a and 45b, respectively.

The memory cell 24 shown in FIG. 48 includes p channel transistors 44a and 44b in place of the load resistances 43a and 43b in the memory cell 24 shown in FIG. 47. The transistor 44a has its drain connected to the storage node 45a, its gate connected to the storage node 45b and its source connected to the power supply 18. The transistor 44b has its drain connected to the storage node 45b, a gate connected to the storage node 45a and its source connected to the power supply 18.

The conventional semiconductor memory device shown in FIGS. 45, 46, 47 and 48 operates as follows. It is assumed that the memory cell 24a is to be selected in the memory cell array 7. In this case, the row address input terminal group 1 applies a row address signal, which corresponds to a row connected to the memory cell 24a to be selected, through the row address buffer 2 to the row decoder 3. Thereby, the row decoder 3 sets the wore line 22 connected to the memory cell 24a at a selection level (e.g., "H" level), and also sets the other word line 23 at a non-selection level (e.g., "L" level).

On the other hand, the column address input terminal group 4 applies a column address signal, which selects a column corresponding to the bit line pair 20a and 20b connected to the memory cell 24a to be selected, through the column address buffer 5 to the column decoder 6. Thereby, the column decoder 6 makes only the transfer gates 27a and 27b connected to the bit line pair 20a and 20b conductive. Consequently, only the selected bit lines 20a and 20b are connected to the IO lines 29a and 29b, while the unselected bit line pair 21a and 21b is isolated from the IO line pair 29a and 29b.

Read operations of the selected memory cell 24a will now be described below. It is assumed that the storage node 45a of the memory cell 24a is at the "H" level and the storage node 45b is at the "L" level. In this case, one of the driver transistor 41a in the memory cell is nonconductive, and the other driver transistor 41b is conductive. Further, the word line 22 is at the "H" level and thus in the selected state, so that both the access transistors 42a and 42b in the memory cell 24a are conductive. Therefore, a direct current flows from the power supply 18 through the bit line load 25b, bit line 20b, access transistor 42b and driver transistor 41b to the ground.

However, the direct current does not flow through the other path, i.e., from the power supply 18 through the bit line load 25a, bit line 20a, access transistor 42a and driver transistor 41a to the ground, because the driver transistor 41a is not conductive. In this operation, the potential in the bit line 20a through which the direct current does not flow has a value of (supply potential−Vth), in which "Vth" is a threshold voltage of the bit line load transistors 25a, 25b, 26a and 26b.

The potential of the bit line 20b through which the direct current flows has a value of (supply potential−Vth−ΔV) which is reduced by ΔV from (supply potential−Vth), because the power-supply voltage is divided by the conductive resistance of the driver transistor 41b, access transistor 42b and of the bit line load 25b. In the above term, ΔV is called a bit line amplitude, and is generally of a value from 50 mV to 500 mV which is adjusted in accordance with a value of the bit line load.

This bit line amplitude appears on the IO lines 29a and 29b through the conductive transfer gates 27a and 27b, and is amplified by the sense amplifier 9. The output from the sense amplifier 9 is amplified by the output buffer 10 and is read as the data output from the output terminal 11. In the reading operation, the input data buffer 13 is controlled not to drive the IO line pair 29a and 29b by the read/write control circuit 16.

In the writing operation, the potential of the bit line for writing the data at the "L" level is forced to a low potential, and the potential of the other bit line is raised to a high potential, whereby the data is written in the memory cell. For example, in order to write an inverted data in the memory cell 24a, the data input buffer 13 sets the IO line 29a at the "L" level and also sets the other IO line 29b at the "H" level, so that the bit line 20a is set at the "L" level and the other bit line 20b is set at the "H" level, whereby the data is written.

FIG. 49 is a circuit diagram illustrating the sense amplifier and the IO line driver circuit. Referring to FIG. 49, n-channel MOSFETs 59 and 60 form a differential input circuit, and have gates to which differential input signals Vin and /Vin are applied, respectively. Sources of the n-channel MOSFETs 59 and 60 are commonly connected and grounded through a n-channel MOSFET 61 for power down. This n-channel MOSFET 61 becomes conductive in response to a chip enable signal (CE) applied to an input terminal 62. Drains of the n-channel MOSFETs 59 and 60 are connected to drains of p-channel MOSFETs 57 and 58 which form a current mirror circuit. The p-channel MOSFETs 57 and 58 have sources connected to the power supply Vcc and gates which are commonly connected. An amplified output is obtained through an output terminal 63 from a node of the n-channel MOSFET 60 and the p-channel MOSFET 58.

The IO line load circuit 50 includes n-channel MOSFETs 55 and 56, sources of which are connected to a pair of the IO lines 29a and 29b forming active loads. These IO lines 29a and 29b are connected through terminals 51 and 52 to the sources of the transfer gates 27a and 28b and the sources of the transfer gates 27b and 28b, respectively. The respective gates and drains of the n-channel MOSFETs 55 and 56 are commonly connected to the power supply Vcc.

As described above, in the semiconductor memory device such as a SRAM, at a periphery of the memory cell array, various circuits (bit line loads, multiplexer, column decoder, sense amplifier, and the like) which are associated to the bit lines are provided. These circuits which are directly associated to the bit lines will be called generally as bit line peripheral circuits hereinafter.

In the conventional semiconductor memory device, the bit lines and the bit line peripheral circuits can be coupled together only at upper and lower terminating ends of the bit lines. Therefore, most of the bit line peripheral circuits are concentrated at the vicinity of the upper and lower ends of the bit lines. This can also be understood from a layout structure of a SRAM chip disclosed in articles "A 14-ns 1-Mbit CMOS SRAM with Variable Bit Organization" (IEEE Journal of Solid-State Circuits, Vol. 23, No. 5, October 1988) and "A 34-ns 1-Mbit CMOS SRAM Using Triple Polysilicon" (IEEE Journal of Solid-State Circuits, Vol. 22, No. 5, October 1987). Therefore, the sizes of the bit line peripheral circuits in the conventional semiconductor memory device largely depend on the bit line pitch. That is, if the bit line pitch is large, it is possible to arrange bit line peripheral circuits having large structures or large driving capacities, (bit line peripheral circuits having transistors of large channel lengths and/or channel widths, and/or many transistors). However, if the bit line pitch is small, only bit line peripheral circuits having small structures or small driving capacities can be arranged. The bit line pitch is determined by the sizes of the memory cells, and has been progressively reduced due to the progress of the high integration technique in recent years. Accordingly, it is impossible in the conventional semiconductor memory device to arrange the bit line peripheral circuits having large areas, and thus it is difficult to obtain an intended performance. For example, a device having a redundancy circuit, of which a program fuse is arranged for every column can be reduced in size only to a restricted extent due to a device for cutting off the fuses, even if reduction of the memory sizes can be achieved owing to the development of the processing technique. Therefore, it is impossible to arrange the fuses for respective columns, and thus the memory sizes can be reduced only to a restricted extent, so that the chip size cannot be sufficiently reduced.

The above problem is caused not only in the SRAMs but also in dynamic RAMs (will be call as "DRAM" hereinafter) and others.

SUMMARY OF THE INVENTION

An object of the invention is to provide a semiconductor memory device in which bit line peripheral circuits having larger structures can be arranged without increasing a chip size.

Another object of the invention is to provide a semiconductor memory device in which bit line peripheral circuits and IO means can be wired or connected without increasing the chip size.

A semiconductor memory device according to a first aspect of the invention comprises a memory cell array including a plurality of word lines, a plurality of bit lines arranged to cross the word lines and a plurality of memory cells arranged at crossings of the word lines and the bit lines. The device further comprises a plurality of bit line signal IO lines arranged to cross the bit lines, each bit line signal IO line being connected to the corresponding bit line and having an end extended to an end of the memory cell array.

A semiconductor memory device according to a second aspect of the invention comprises a plurality of memory cell arrays, each of which includes a plurality of word lines, a plurality of bit lines arranged to cross the word lines and a plurality of memory cells arranged at crossings of the word lines and the bit lines. The device further comprises a plurality of bit line signal IO lines which are arranged to cross the bit lines in the respective memory cell arrays and are adapted to connect the corresponding bit lines to each other in the respective memory cell arrays.

A semiconductor memory device according to a third aspect of the invention comprises, in addition to the memory cell array in the first aspect of the invention, a plurality of bit line signal IO lines, a bit line peripheral circuit, IO means and a plurality of IO lines. The bit line signal IO lines are arranged to cross the bit lines and connected to the corresponding bit lines, and each has at least one end extended to an end of the memory cell array. A bit line peripheral circuit is arranged at an end of the memory cell array and is coupled to the bit line signal IO lines. IO means receives external data and signals and outputs internal signals and data to the outside. IO lines are arranged to pass over the memory cell array and to couple the bit line peripheral circuit and the IO means with each other.

In the semiconductor memory device according to the first aspect of the invention, the bit line signal IO lines connected to the bit lines are extended to end portions, in a direction perpendicular to the bit lines, of the memory cell array, so that the bit line peripheral circuits, which could be arranged only at upper and lower ends of the bit lines in the prior art, can be dispersedly arranged also at the ends of the bit line signal IO lines. Consequently, a degree of freedom is increased in a layout for the bit line peripheral circuits, and the bit line peripheral circuits having larger structures can be arranged without increasing the bit line pitch.

In the semiconductor memory device according to the second aspect of the invention, the corresponding bit lines in each memory cell array are connected together by the bit line signal IO line so that the bit line peripheral circuits, which have been individually provided for the respective memory cell arrays in the prior art, can be commonly used by the memory cell arrays. Consequently, each memory cell array can substantially have a larger area for arranging the bit line peripheral circuits, and thus the bit line peripheral circuits having larger structures can be arranged.

In the semiconductor memory device according to the third aspect of the invention, the IO lines passing over the memory cell array connect the bit line peripheral circuits to the IO means, so that wirings, which have been located outside the memory cell array in the prior art, can be arranged on the memory cell array, resulting in reduction of the chip size.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 37 is a block diagram showing a structure of a fourteenth embodiment of the present invention.

DESCRIPTION OF THE PREFERRED EMBODIMENTS

First Embodiment

Figure 1:
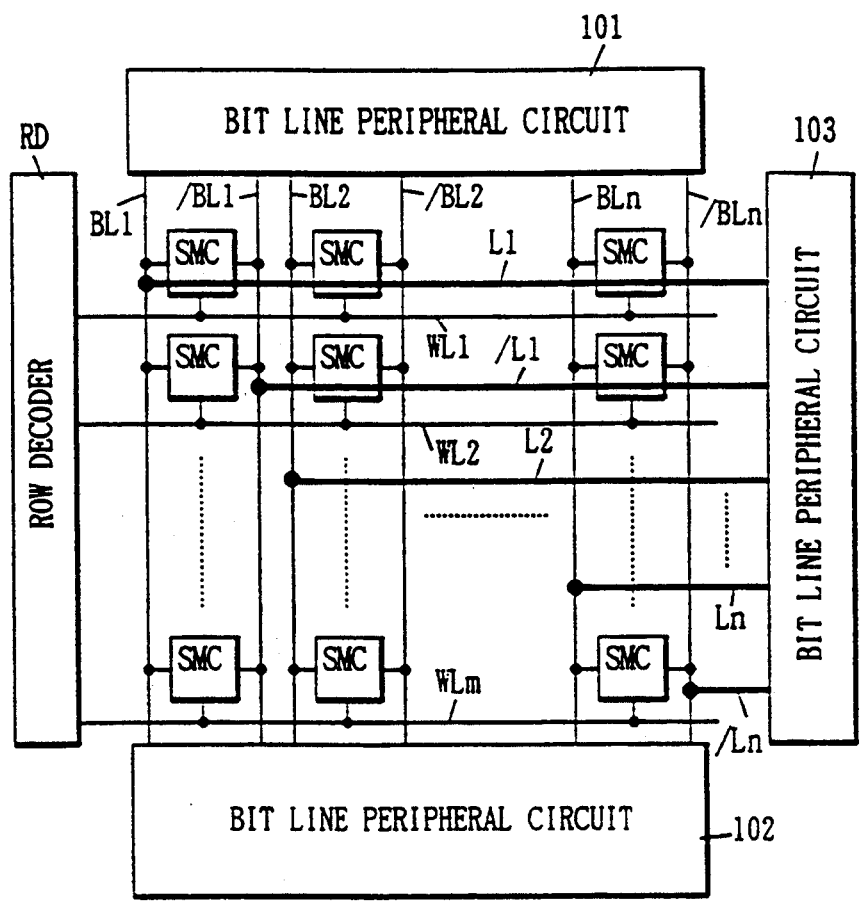
FIG. 1 is a block diagram showing a structure of a first embodiment of the present invention.
Figure 47:
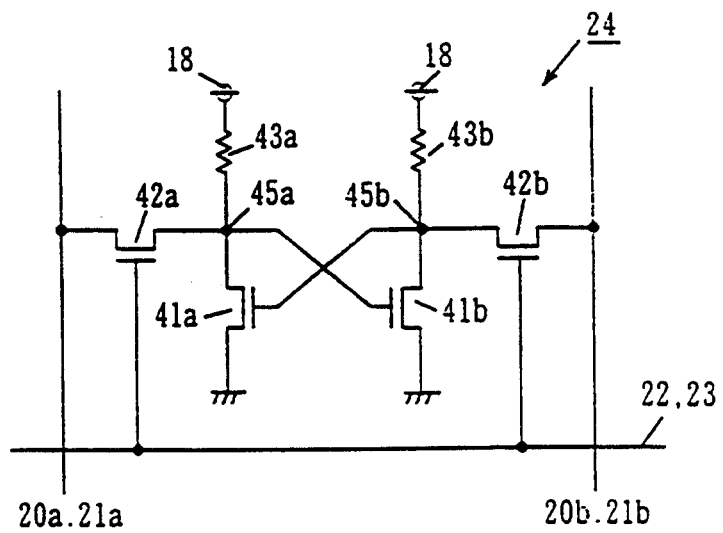
FIG. 47 is a circuit diagram showing one example of a structure of the memory cell shown in FIG. 46.
Figure 48:
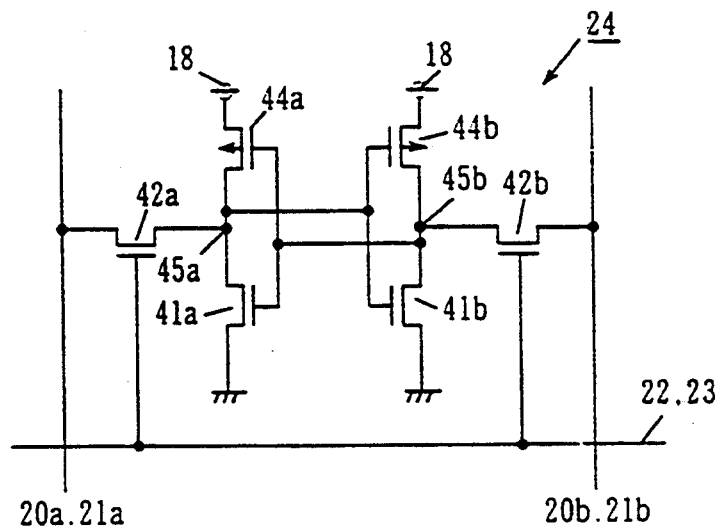
FIG. 48 is a circuit diagram showing another example of the structure of the memory cell shown in FIG. 46.
Figure 49:
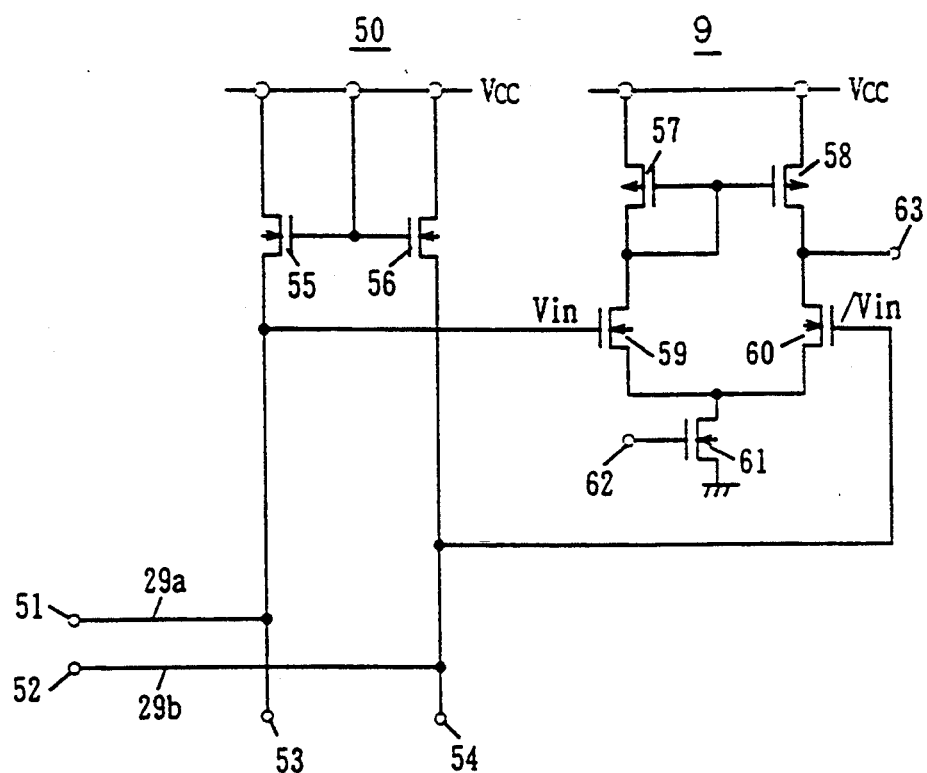
FIG. 49 is a circuit diagram showing a structure of a sense amplifier and an IO driving circuit in the SRAM shown in FIG. 45.

In FIG. 1, which is a block diagram illustrating structures of a memory cell array and peripheral portions of a SRAM of a first embodiment of the invention, word lines WL1-WLm are arranged to cross (preferably at a right angle) a plurality of bit lines BL1, /BL1, BL2, /BL2, ... BLn and /BLn. The bit lines form bit line pairs, each of which includes two adjacent lines. For example, the bit lines BL1 and /BL1 form one bit line pair, and the bit lines BL2 and /BL2 also form one bit line pair. Static memory cells SMCs are arranged at crossings of these bit line pairs and word lines to form a memory cell array. The static memory cells SMCs may be formed of, e.g., memory cells shown in FIGS. 47 and 48. The word lines WL1-WLm receive output signals RD from a row decoder. The row decoder RD is adapted to decode row address signals applied through an address buffer (not shown) and to select one of the word lines WL1-WLm. A peripheral circuit 101 is provided at one end of each of the bit line pairs BL1, /BL1, ... BLn and /BLn, and a peripheral circuit 102 is provided at the other end. The structures described above are the same as those of the conventional SRAM.

This first embodiment has such a characteristic feature that bit line signal IO lines L1, /L1, ... Ln and /Ln are arranged to cross the bit lines BL1, /BL1, ... BLn and /BLn. The bit line signal IO lines L1, /L1, ... Ln and /Ln are connected to the corresponding bit lines BL1, /BL1, ... BLn and /BLn, and are adapted to input predetermined signals to the corresponding bit lines and also to output signals, which are obtained from the corresponding bit lines, from the memory cell array, respectively. In the embodiment in FIG. 1, the bit line signal IO lines L1, /L1, ... Ln and /Ln are connected at their left ends in the figure to the corresponding bit lines, and are extended at the right ends beyond the right side of the memory cell array, i.e., oppositely to the side in which the row decoder RD is arranged. The bit line signal IO lines L1, /L1, ... Ln and /Ln are arranged parallel to the word lines WL1, WL2, ... WLm.

A bit line peripheral circuit 103 is coupled to the respective right ends of the bit line signal IO lines L1, /L1, ... Ln and /Ln extended outside the memory cell array. In the conventional SRAM, bit line peripheral circuits can be arranged only at the upper and lower ends of the bit lines (i.e., at positions occupied by the bit line peripheral circuits 101 and 102) as described above. In the embodiment in FIG. 1, the bit line peripheral circuit 103 can be arranged even at the end in a direction perpendicular to the bit line, of the memory cell array. This means that an area for arranging the bit line peripheral circuits is increased. Consequently, the bit line peripheral circuits can be dispersedly arranged in a larger area, and thus the bit line peripheral circuits having structures larger than that in the conventional circuits can be disposed without increasing a bit line pitch.

Figure 2:
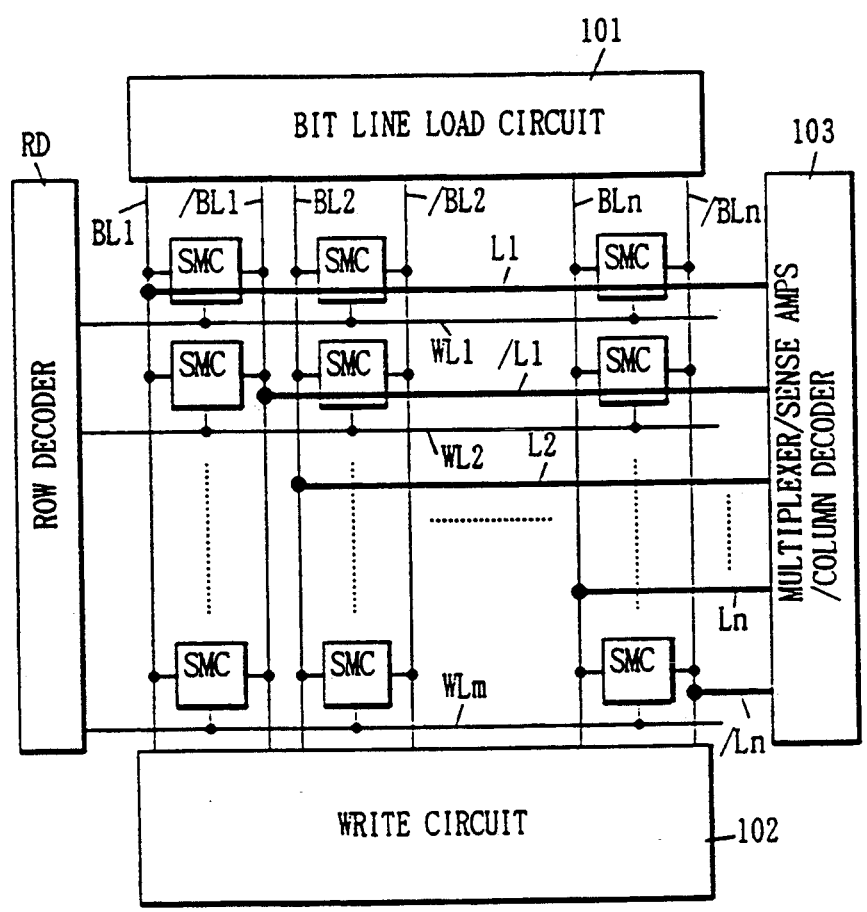
FIG. 2 is a block diagram showing an example of dispersed arrangement of various bit line peripheral circuits in the embodiment shown in FIG. 1.
Figure 3:
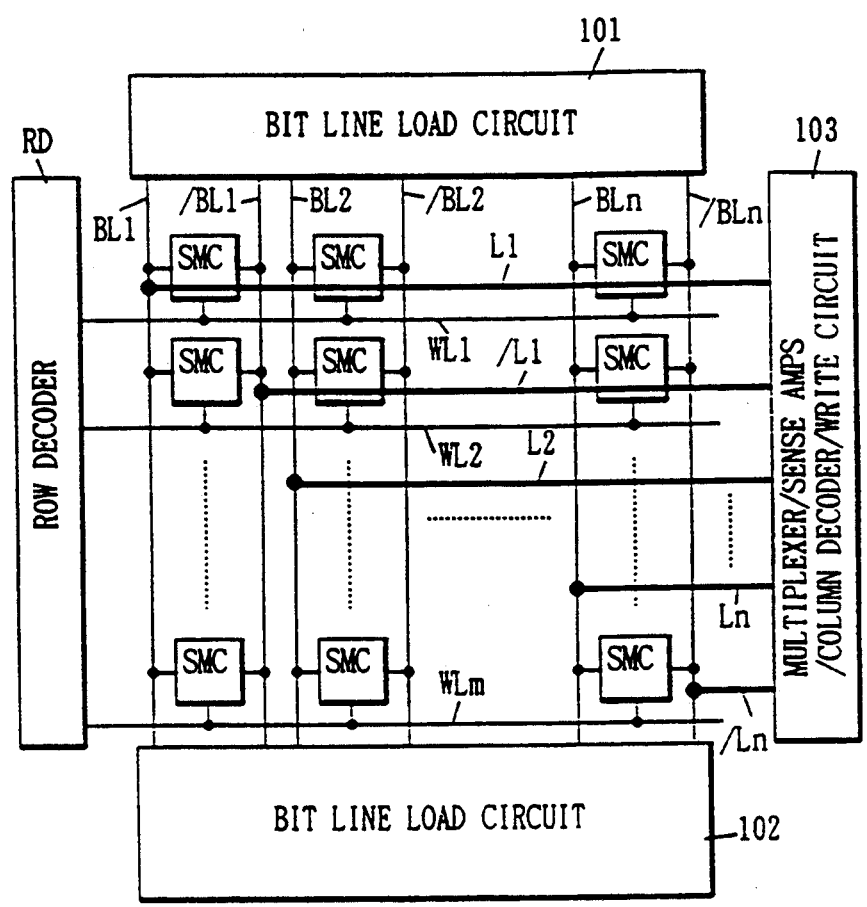
FIG. 3 is a block diagram showing another example of dispersed arrangement of the various bit line peripheral circuits in the embodiment of FIG. 1.

FIGS. 2 and 3 illustrate examples of the layout of the bit line peripheral circuits in the embodiment in FIG. 1. In FIG. 2, the bit line peripheral circuit 101 includes a bit line load circuit, the bit line peripheral circuit 102 includes a write circuit 102, and the bit line peripheral circuit 103 includes a multiplexer, a sense amplifier group and a column decoder. In FIG. 3, the bit line peripheral circuit 101 includes a bit line load circuit, the bit line peripheral circuit 102 includes a bit line load circuit 102, and the bit line peripheral circuit 103 includes a multiplexer, a sense amplifier group, a column decoder and a write circuit. It should be noted that the FIGS. 2 and 3 illustrate only examples and actual circuits arranged as the bit line peripheral circuits may be of any other forms.

Figure 4:
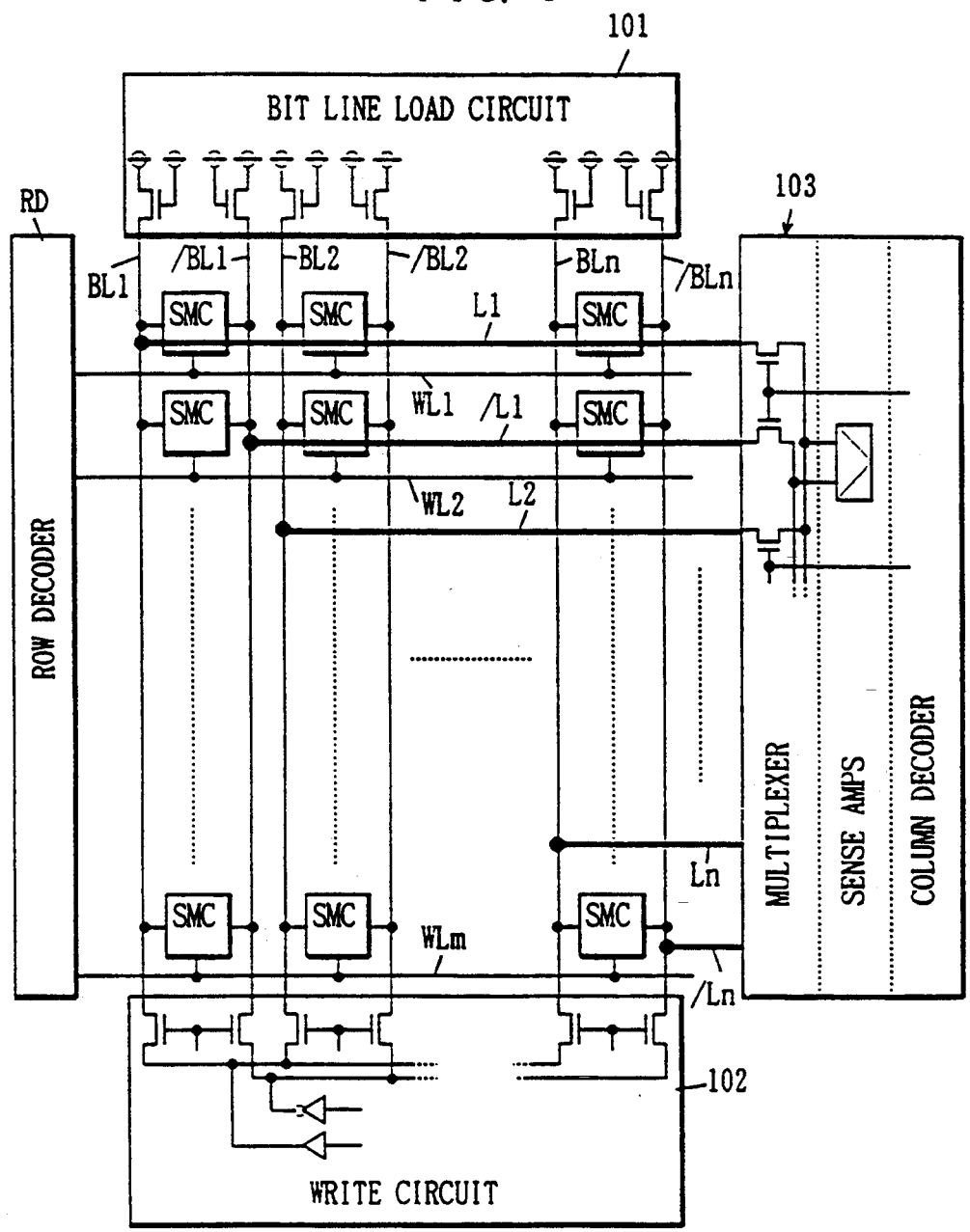
FIG. 4 shows more specific example of the embodiment shown in FIG. 2.
Figure 5:
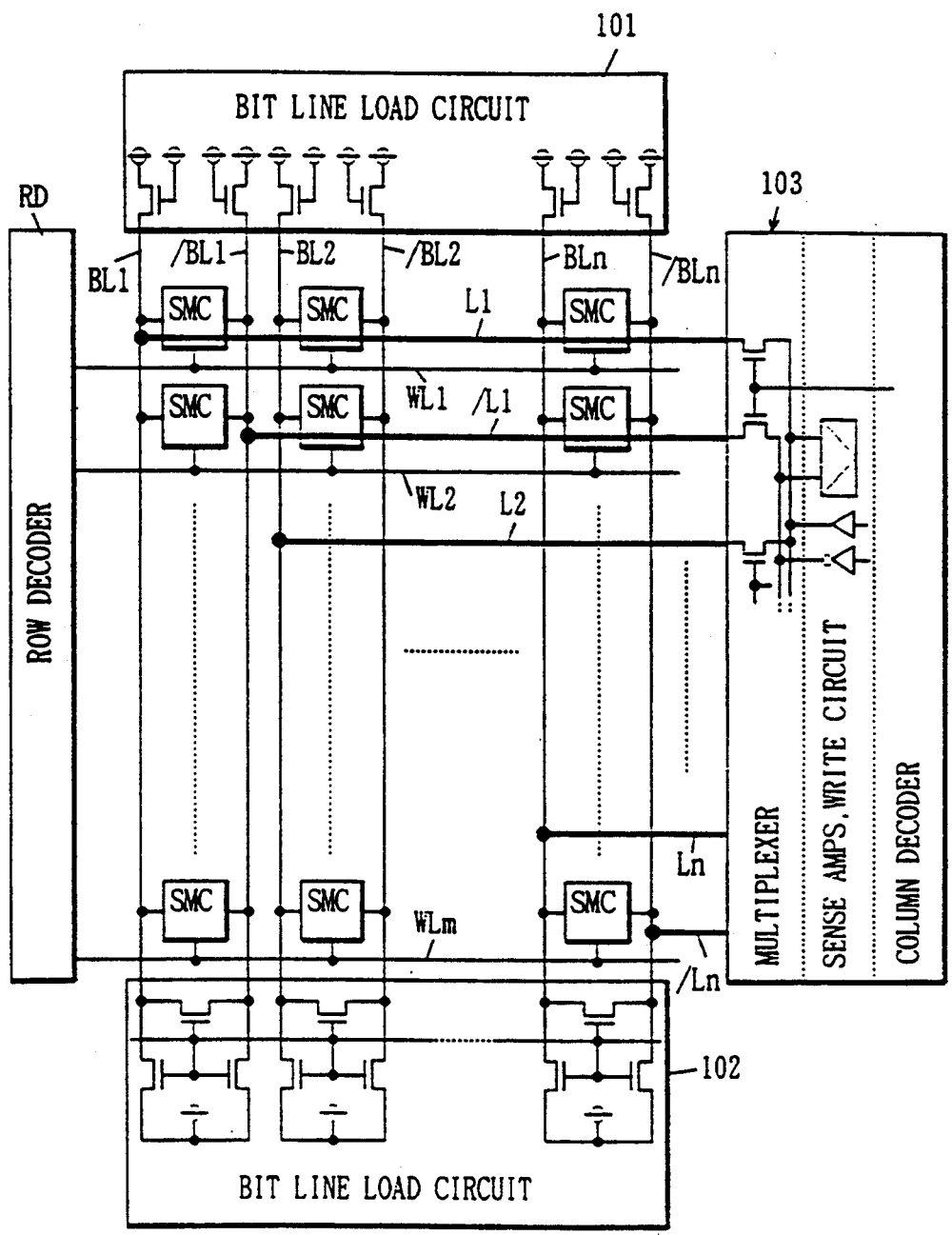
FIG. 5 shows a more specific example of the embodiment shown in FIG. 3.

FIG. 4 shows a more detailed example of the circuit structure of the embodiment shown in FIG. 2. FIG. 5 shows a more detailed example of the circuit structure of the embodiment shown in FIG. 3.

The pitch of the bit line signal IO lines L1, /L1, ... Ln and /Ln depends on the longitudinal size or distance between the upper and lower sides of the memory cell array, and does not depend on the pitch of the bit lines. Therefore, if the SRAM is designed to have the longitudinal size of the memory cell array larger than the lateral size, the pitch of the bit line signal IO lines can be wider than the pitch of the bit lines. These structures allow the arrangement of a bit line peripheral circuit having large structures as the bit line peripheral circuit 103, which has been impossible at the ordinary bit line pitch.

Figure 6:
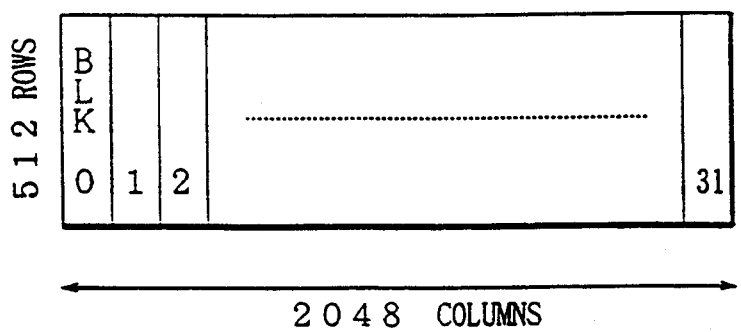
FIG. 6 is a diagram showing a typical structure of a 1M bit SRAM.
Figure 7:
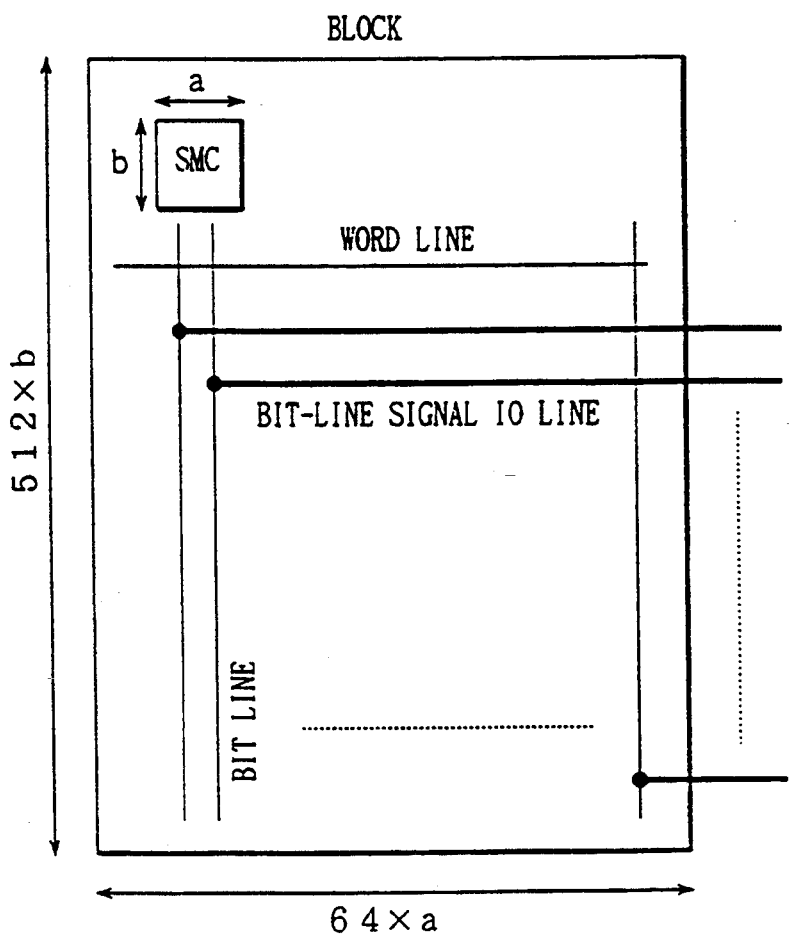
FIG. 7 is a diagram showing a structure of 1 block of SRAM shown in FIG. 6.

The pitch of the bit line signal IO lines and the pitch of the bit lines will be compared referring to a typical model of a 1M bit SRAM. Referring to FIG. 6, a 1M bit SRAM is divided into 32 blocks, that is, 0 to 31. As shown in FIG. 7, each block includes static memory cells SMCs in 512 rows×64 columns. Since 2 bit lines are connected to each static memory cell SMC, the number of bit lines per 1 block is 64×2=128. Similarly, the number of the bit line signal IO lines is 128 per 1 block. Now, when we represent the width of each static memory cell SMC in the word line direction by a and the width in the bit line direction by b, the pitch P1 of the bit line signal IO lines is represented as $$P1=(512\times b)/128=4b$$

while the bit line pitch P2 is represented as $$P2=(64\times a)/128=a/2$$

Generally, the widths are selected to be b>a. If $a=5.8$ μm and $b=8.5$ μm (b/a=1.47), for example, then $$P1=34.0 \mu m$$

$$P2=2.90 \mu m.$$

Namely, the pitch of the bit line IO lines is wider than the bit line pitch.

Second Embodiment

Figure 8:
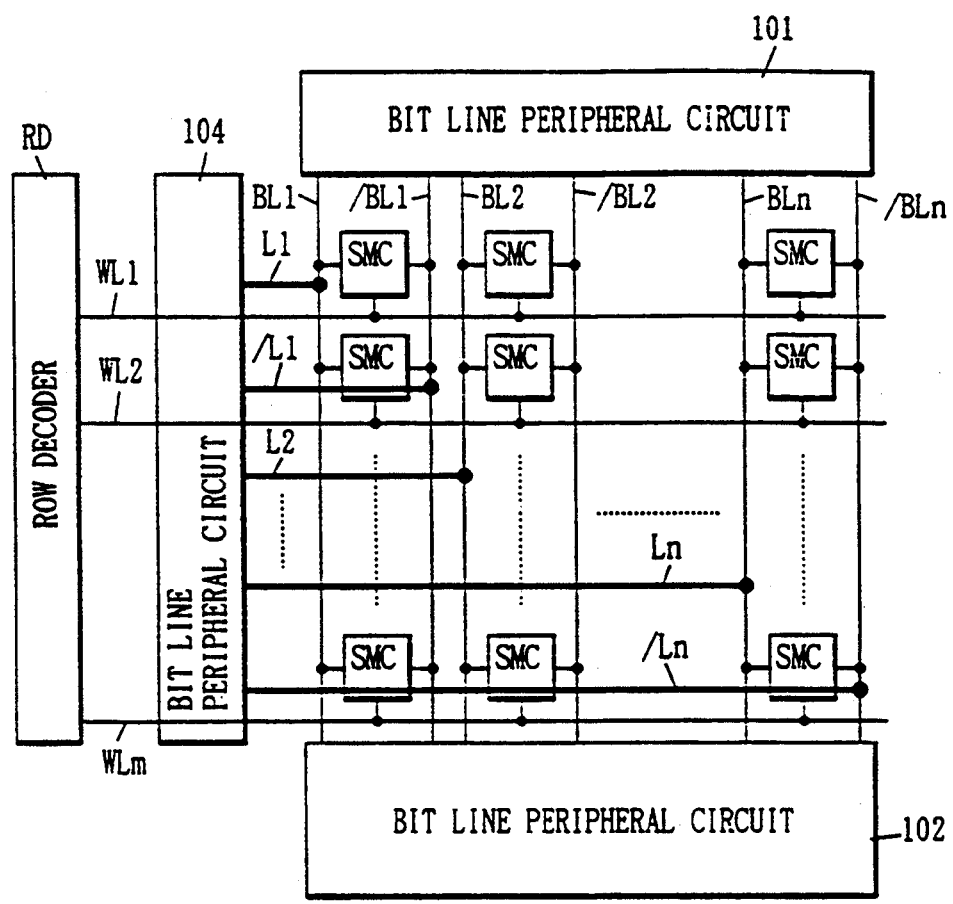
FIG. 8 is a block diagram showing a structure of a second embodiment of the present invention.

FIG. 8 is a block diagram illustrating structures of a memory cell array and peripheral portions of a SRAM of a second embodiment of the invention. In the illustrated second embodiment, the bit line signal IO lines L1, /L1, . . . Ln and /Ln have the right ends in the figure connected to the corresponding bit lines BL1, /BL1, . . . BLn and /BLn, respectively, and have the left ends, which are extended outside the memory cell array, coupled to a bit line peripheral circuit 104. Therefore, the bit line peripheral circuit 104 is arranged to the left of the memory cell array, i.e., between the row decoder RD and the memory cell array. Other structures are same as those of the first embodiment in FIG. 1.

Figure 9:
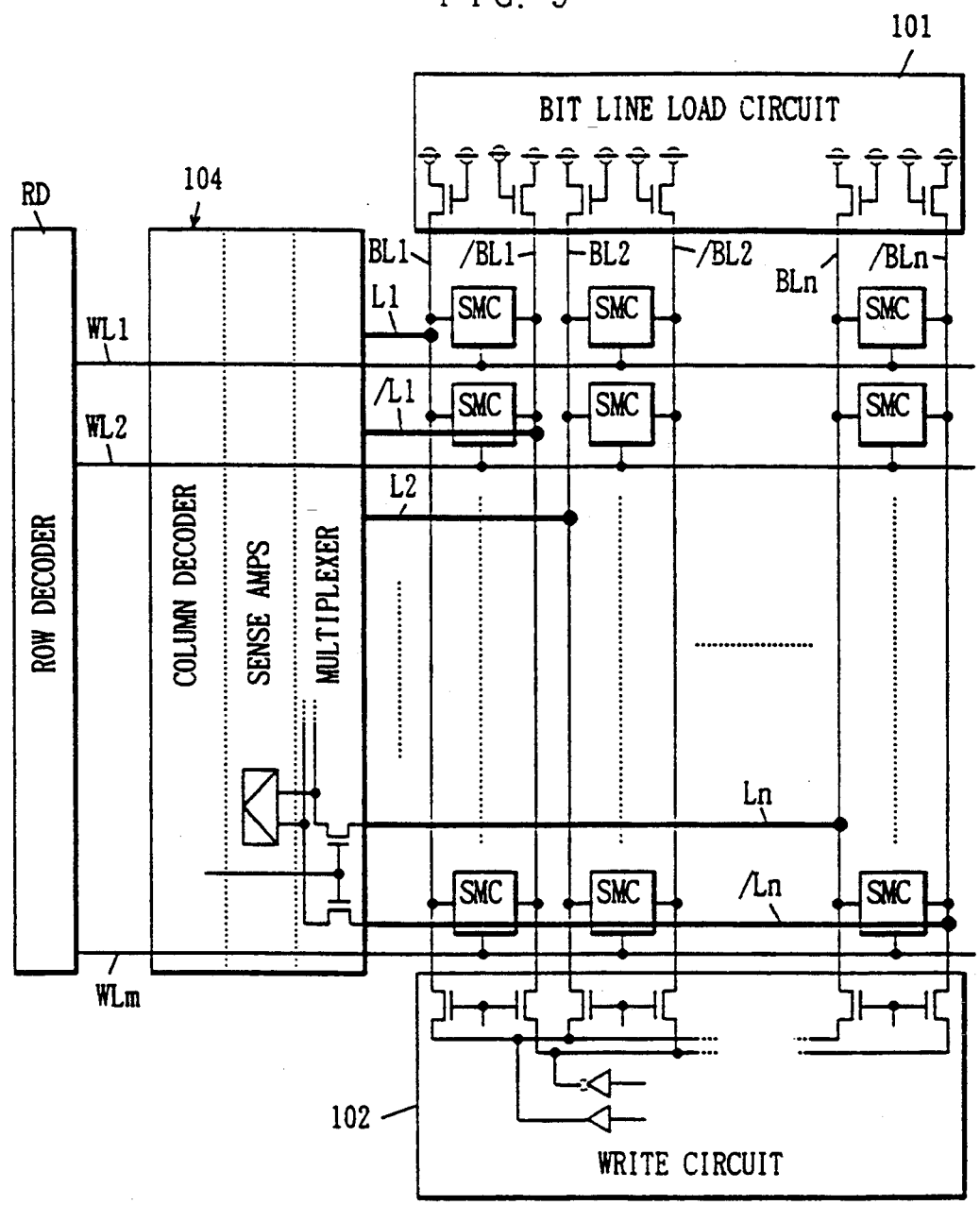
FIG. 9 shows a more specific example of the embodiment shown in FIG. 8.

FIG. 9 is a specific, more detailed example of the embodiment of FIG. 8.

Third Embodiment

Figure 10:
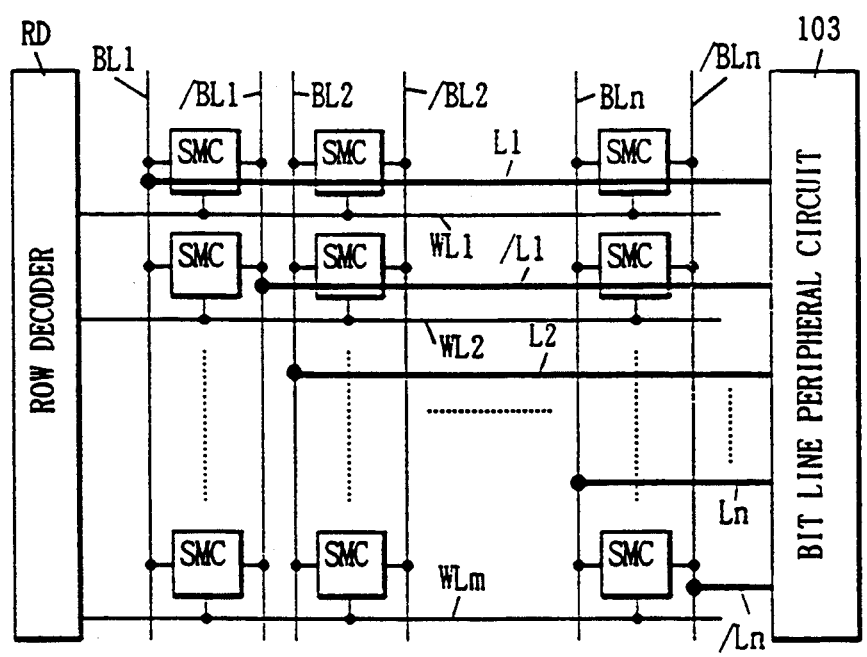
FIG. 10 is a block diagram showing a structure of a third embodiment of the present invention.

FIG. 10 is a block diagram illustrating structures of a memory cell array and peripheral portions of a SRAM of a third embodiment of the invention. In the illustrated third embodiment, the bit line peripheral circuit 103 is arranged only at ends of the bit line signal IO lines L1, /L1, . . . Ln and /Ln. This layout is allowed by a fact that the pitch of the bit line signal IO lines can be wider than that of the bit lines, as stated before. Other structures are the same as those in the first embodiment in FIG. 1.

Figure 11:
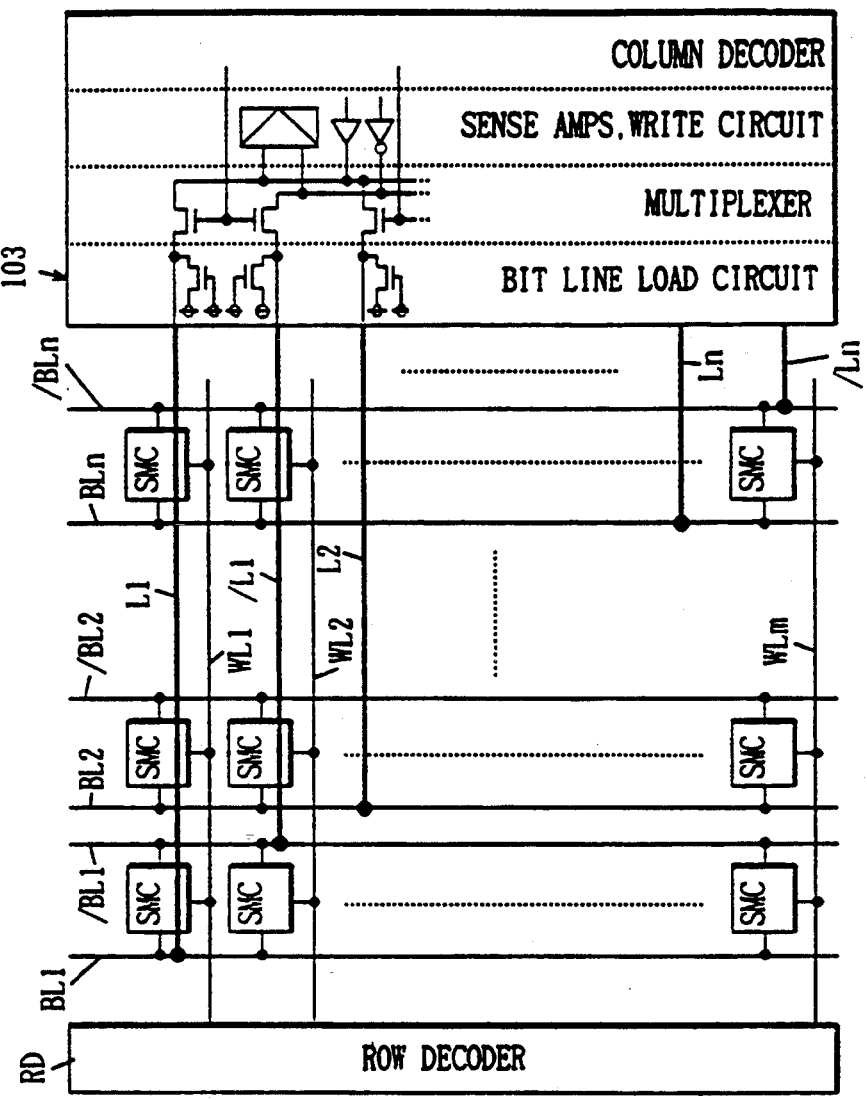
FIG. 11 shows a more specific example of the embodiment shown in FIG. 10.

FIG. 11 is a specific, more detailed example of the embodiment of FIG. 10.

Fourth Embodiment

Figure 12:
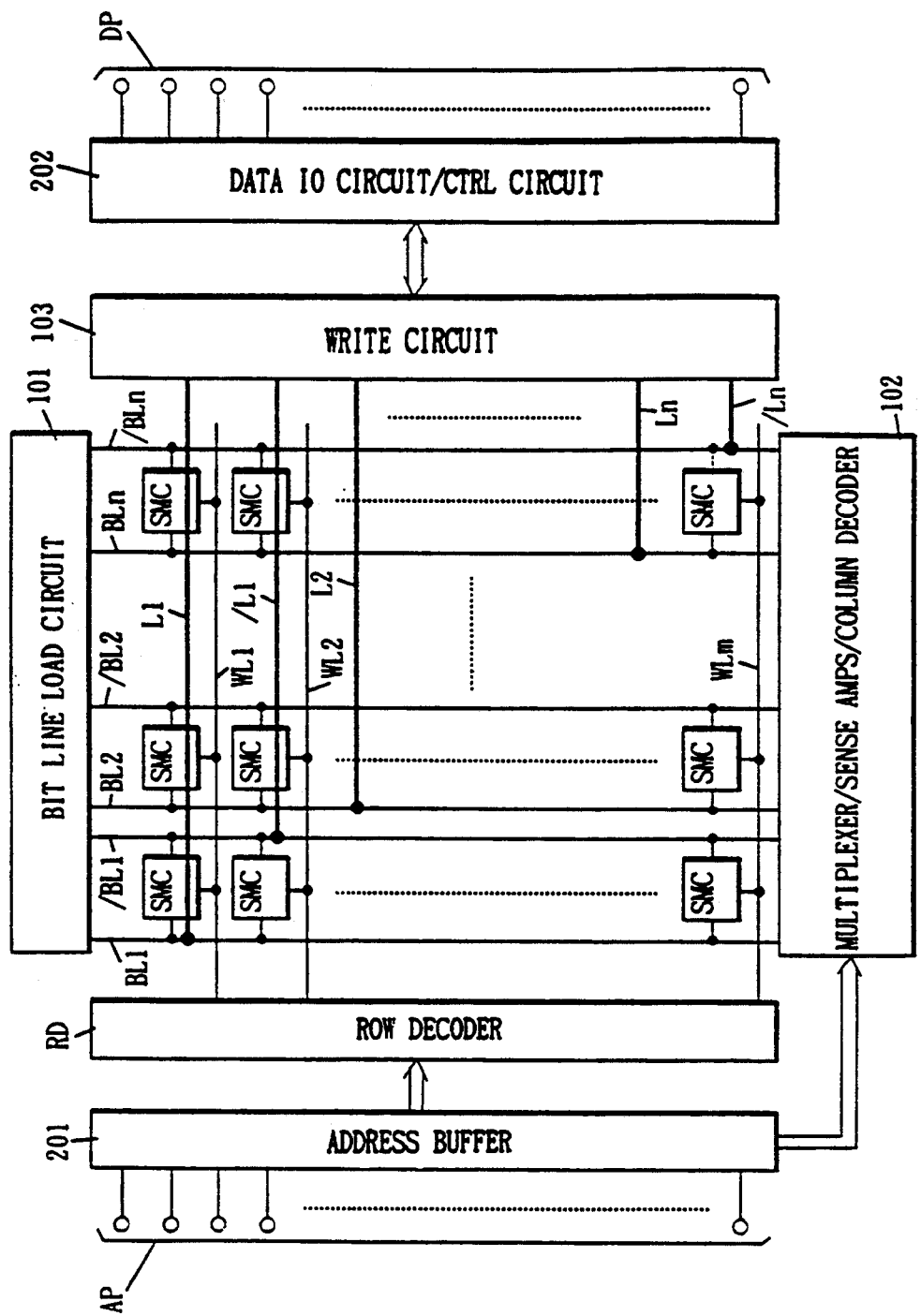
FIG. 12 is a block diagram showing a structure of a fourth embodiment of the present invention.

FIG. 12 is a block diagram illustrating structures of an SRAM of a fourth embodiment of the invention. The illustrated fourth embodiment is provided with three bit line peripheral circuits 101-103. The bit line peripheral circuit 101 includes a bit line load circuit. The bit line peripheral circuit 102 includes a multiplexer, a sense amplifier group and a column decoder. The bit line peripheral circuit 103 includes a write circuit. The SRAM chip is provided at one end with an address signal input pin group AP and is provided at the other end with a data signal IO pin group DP. The address signal input pin group AP receives external address signals, which are applied to an address buffer 201. The address buffer 201 applies row address signals out of the applied address signals to the row decoder RD and also applies column address signals to the column decoder in the bit line peripheral circuit 102. The data signal IO pin group DP receives external write data and control data. The write data coming through the data signal IO pin group DP is applied through a data IO circuit/control circuit 202 to the bit line peripheral circuit 103. The control data coming through the data signal IO pin group DP is applied through the data IO circuit/control circuit 202 to various circuits in the SRAM. The read data obtained from the sense amplifier group in the bit line peripheral circuit 102 is applied through the data IO circuit/control circuit 202 to the data signal IO pin group DP and is sent out from the SRAM chip.

Figure 13:
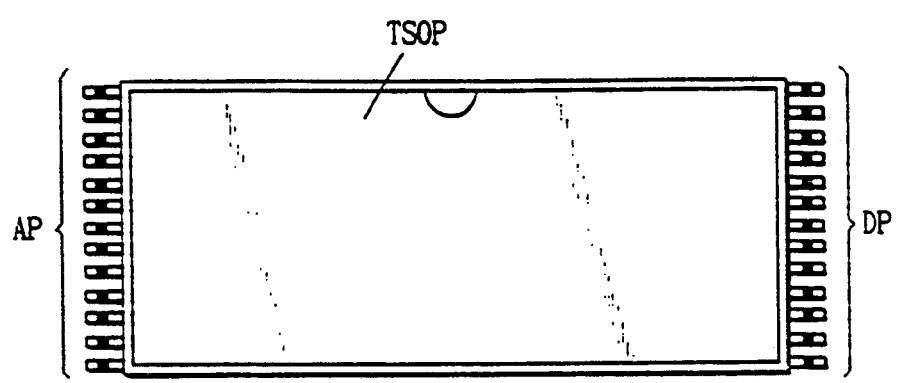
FIG. 13 shows one example of a package containing the SRAM shown in FIG. 12.

As described above, the embodiment in FIG. 12 can include the address signal input pins concentrated at one end of the SRAM chip and the data signal IO pins concentrated at the other end, so that the SRAM chip can be housed in a thin small outline package TSOP shown in FIG. 13.

Figure 14:
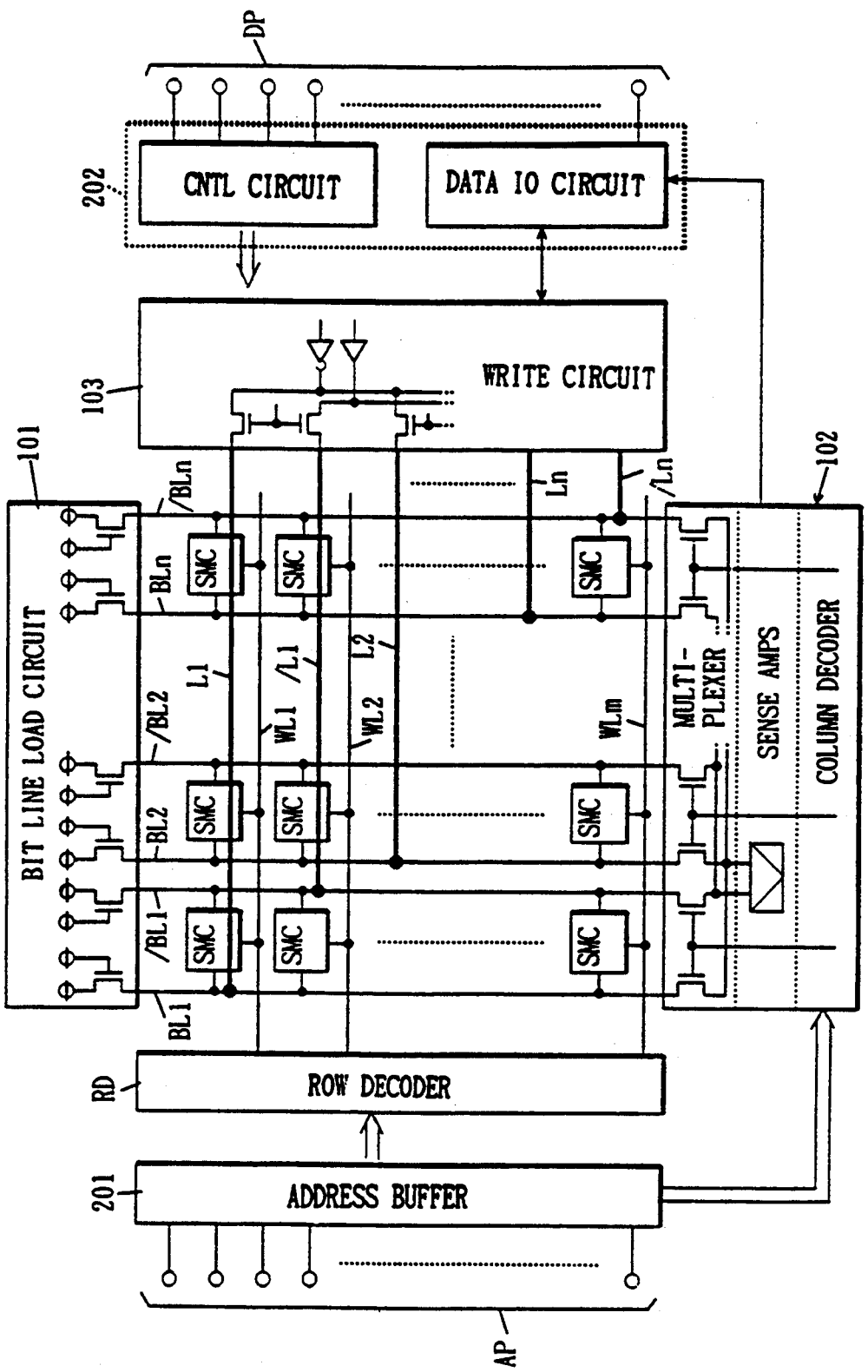
FIG. 14 shows a more specific example shown in detail, of the embodiment shown in FIG. 12.

FIG. 14 is a specific, more detailed example of the embodiment of FIG. 12.

Fifth Embodiment

Figure 15:
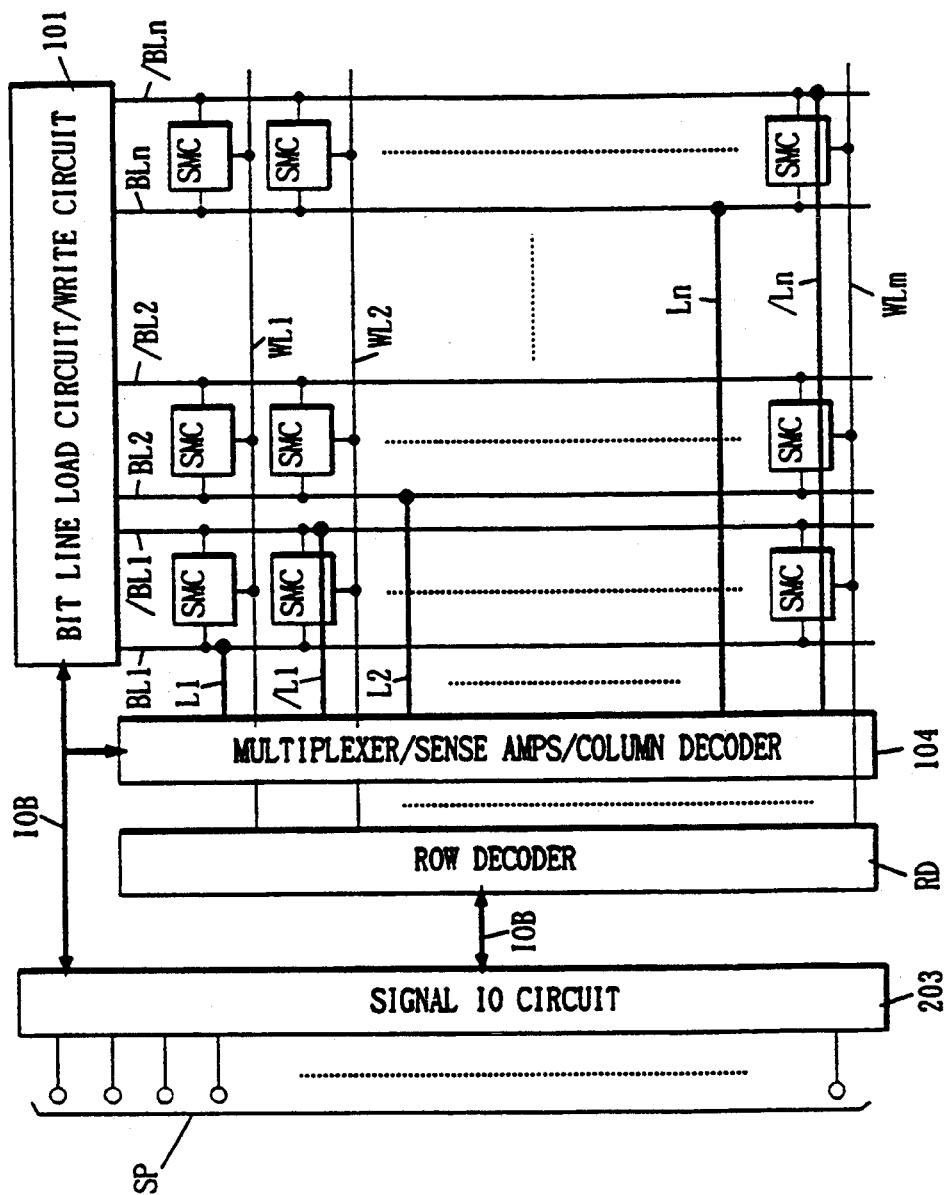
FIG. 15 is a block diagram showing a structure of a fifth embodiment of the present invention.

FIG. 15 is a block diagram illustrating whole structures of a SRAM of a fifth embodiment of the invention. In the illustrated fifth embodiment, the bit line peripheral circuit 101 includes the bit line load circuit and the write circuit. The bit line peripheral circuit 104 includes the multiplexer, the sense amplifier group and the column decoder. The SRAM chip is provided at one end with the signal IO pin group SP which receives external address signals, write data and control data. The signal and data inputted through the signal IO pin group SP are applied through the signal IO circuit 203 and a data IO bus IOB to the row decoder RD and the bit line peripheral circuits 101 and 104. The read data obtained from the sense amplifier group in the bit line peripheral circuit 104 is applied through the data IO bus IOB and the signal IO circuit 203 to the signal IO pin group SP, and is outputted from the SRAM chip.

Figure 16:
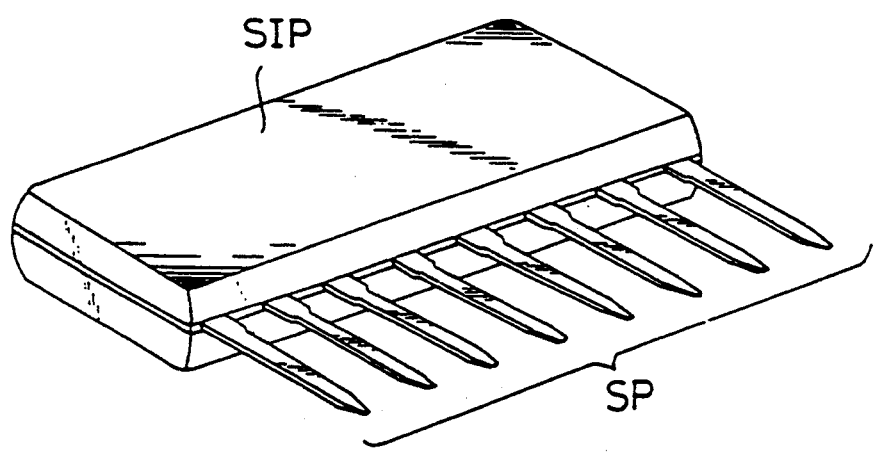
FIG. 16 is a perspective view showing one example of a package containing the SRAM of FIG. 15.

In the embodiment in FIG. 15 described above, all of the signal IO pins can be arranged at one side of the SRAM chip. Therefore, the SRAM chip can be easily housed, for example, in a single in-line package SIP shown in FIG. 16.

Figure 17:
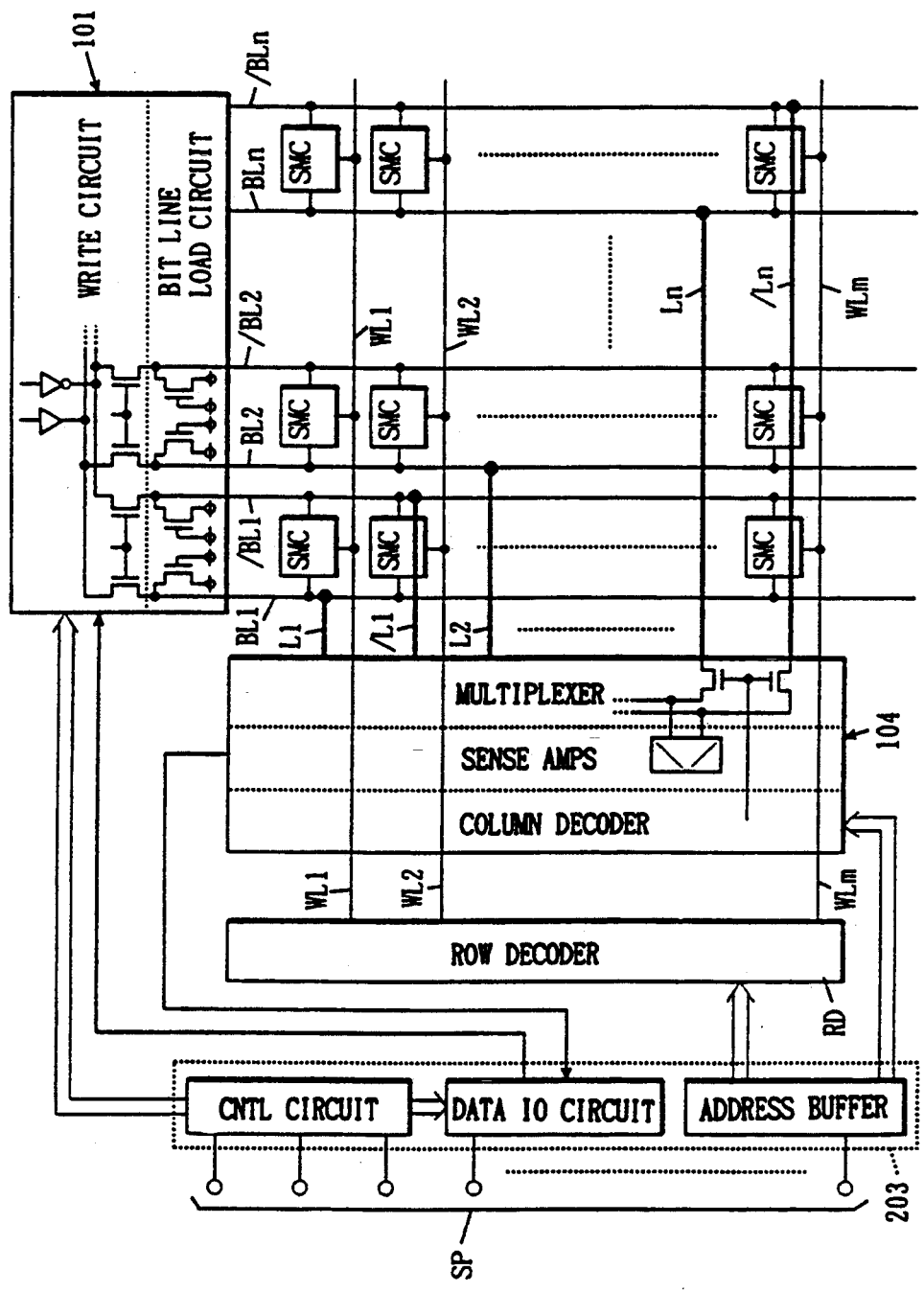
FIG. 17 shows a more specific example shown in detail of the example shown in FIG. 15.

FIG. 17 is a specific, more detailed example of the embodiment of FIG. 15.

Sixth Embodiment

Figure 18:
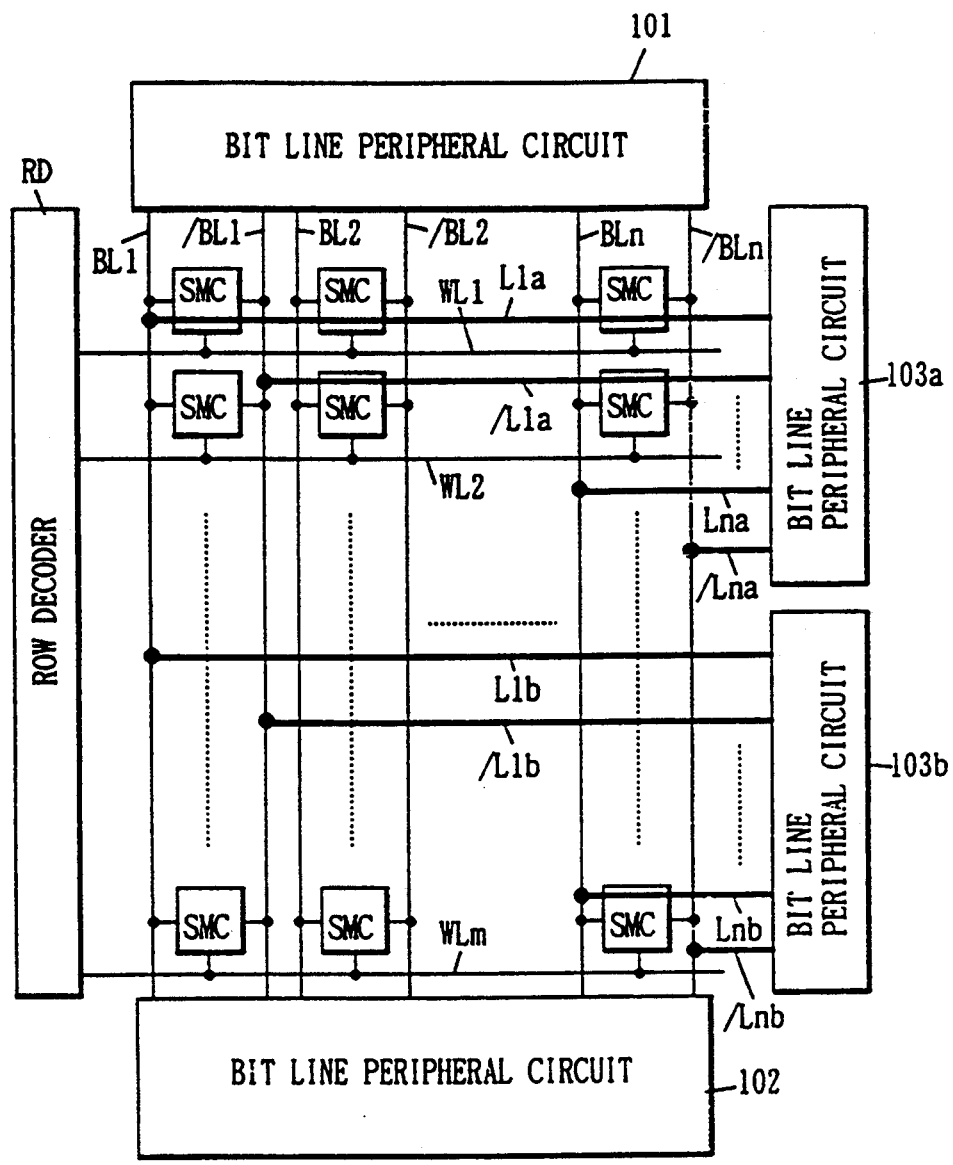
FIG. 18 is a block diagram showing a structure of a sixth embodiment of the present invention.

FIG. 18 is a block diagram illustrating structures of a memory cell array and peripheral portions of a SRAM of a sixth embodiment of the invention. The illustrated sixth embodiment includes two sets of the bit line signal IO lines, i.e., the bit line signal IO lines L1a, /L1a, . . . Lna and /Lna, and the bit line signal IO lines L1b, /L1b, . . . Lnb and /Lnb corresponding to one set of the bit lines BL1, /BL1, . . . BLn and /BLn. The bit line peripheral circuit 103a is arranged at the right ends of the bit line signal IO lines L1a, /L1a, . . . Lna and /Lna, and the bit line peripheral circuit 103b is arranged at the right ends of the bit line signal IO line L1b, /L1b, . . . Lnb and /Lnb.

Figure 19:
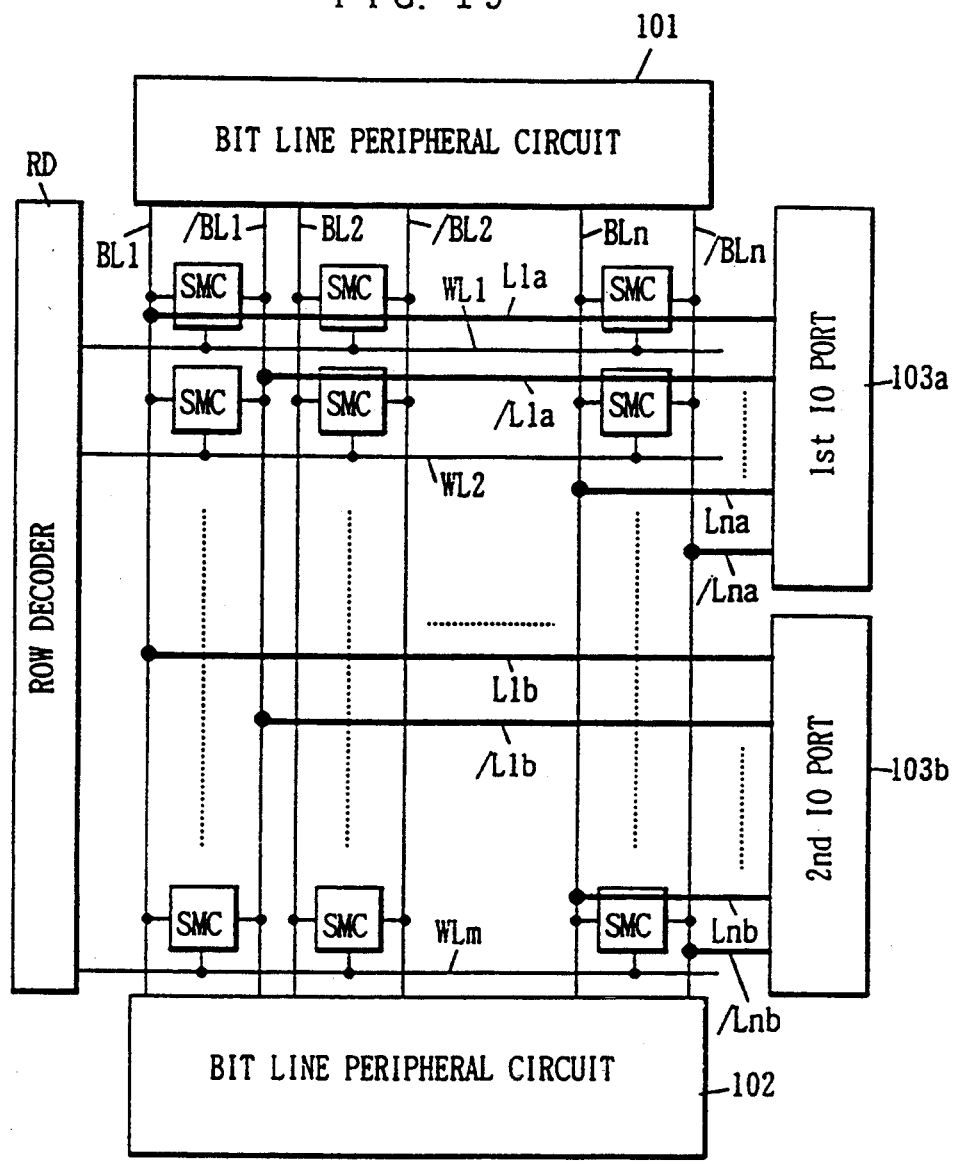
FIG. 19 is a block diagram showing an example of a dispersed arrangement of the bit line peripheral circuits of the embodiment shown in FIG. 18.

According to the above structures, the bit line peripheral circuits 103a and 103b can form first and second IO ports, respectively, as shown in FIG. 19, which allows the formation of the SRAM having a plurality of IO ports.

Figure 20:
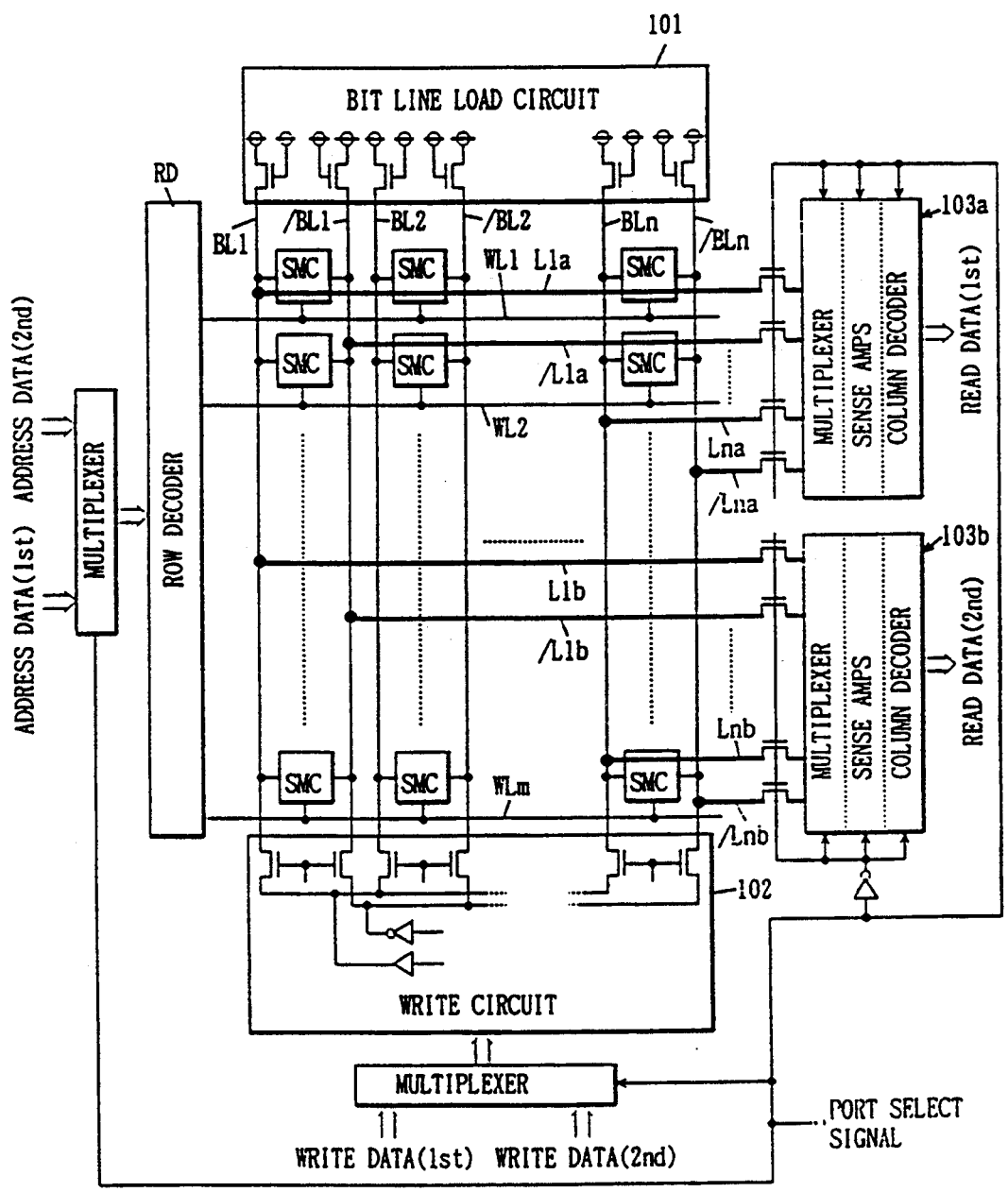
FIG. 20 shows a more specific example shown in detail of the embodiment shown in FIG. 19.

FIG. 20 is a specific, more detailed example of the embodiment of FIG. 19.

Seventh Embodiment

Figure 21:
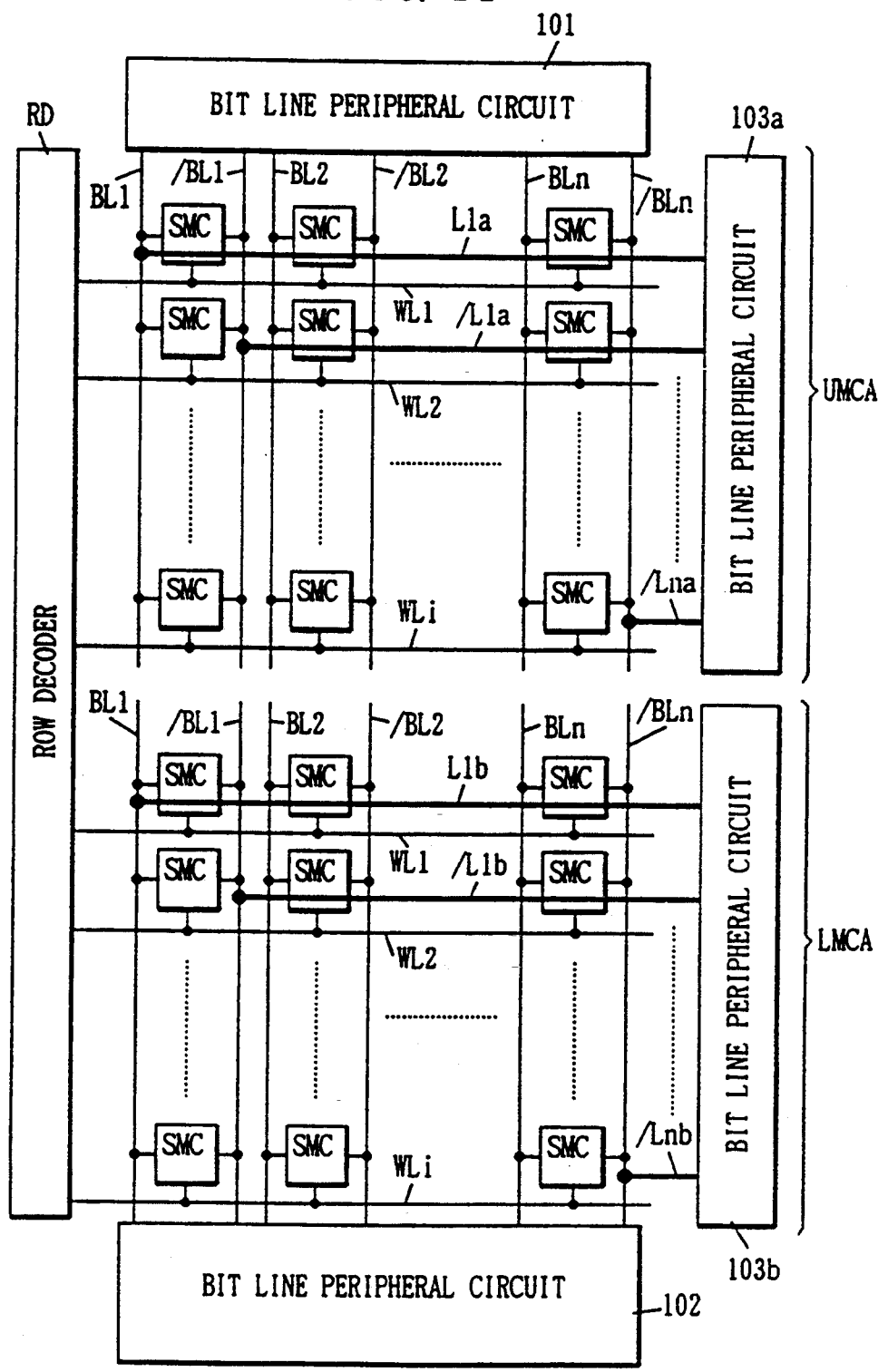
FIG. 21 is a block diagram showing a structure of a seventh embodiment of the present invention.

FIG. 21 is a block diagram illustrating structures of memory cell arrays and peripheral portions of a SRAM of a seventh embodiment of the invention. In the illustrated seventh embodiment, the memory cell array in the first embodiment described with reference to FIG. 1 is divided into an upper memory cell array UMSA and a lower memory cell array LMSA. Accordingly, the upper and lower memory cell arrays UMSA and LMSA each includes i word lines WL1-WLi (i=n/2). The upper memory cell array UMSA is provided with the bit lines BL1, /BL1, ... BLn and /BLn end the bit line signal IO lines L1a, /L1a, ... Lna and /Lna associated to the bit lines and coupled to the bit Line peripheral circuit 103a. The lower memory cell array LMSA is provided with the bit lines BL1, /BL1, ... BLn and /BLn and the bit line signal IO lines L1b, /L1b, ... Lnb and /Lnb associated to the bit lines and coupled to the bit line peripheral circuit 103b. Other structures are the same as those in the previously stated first embodiment in FIG. 1.

In the above structures, each bit line has a divided structure, so that the bit line capacity is reduced to a half, resulting in such an advantage that the memory cells can operate at a high speed.

Figure 22:
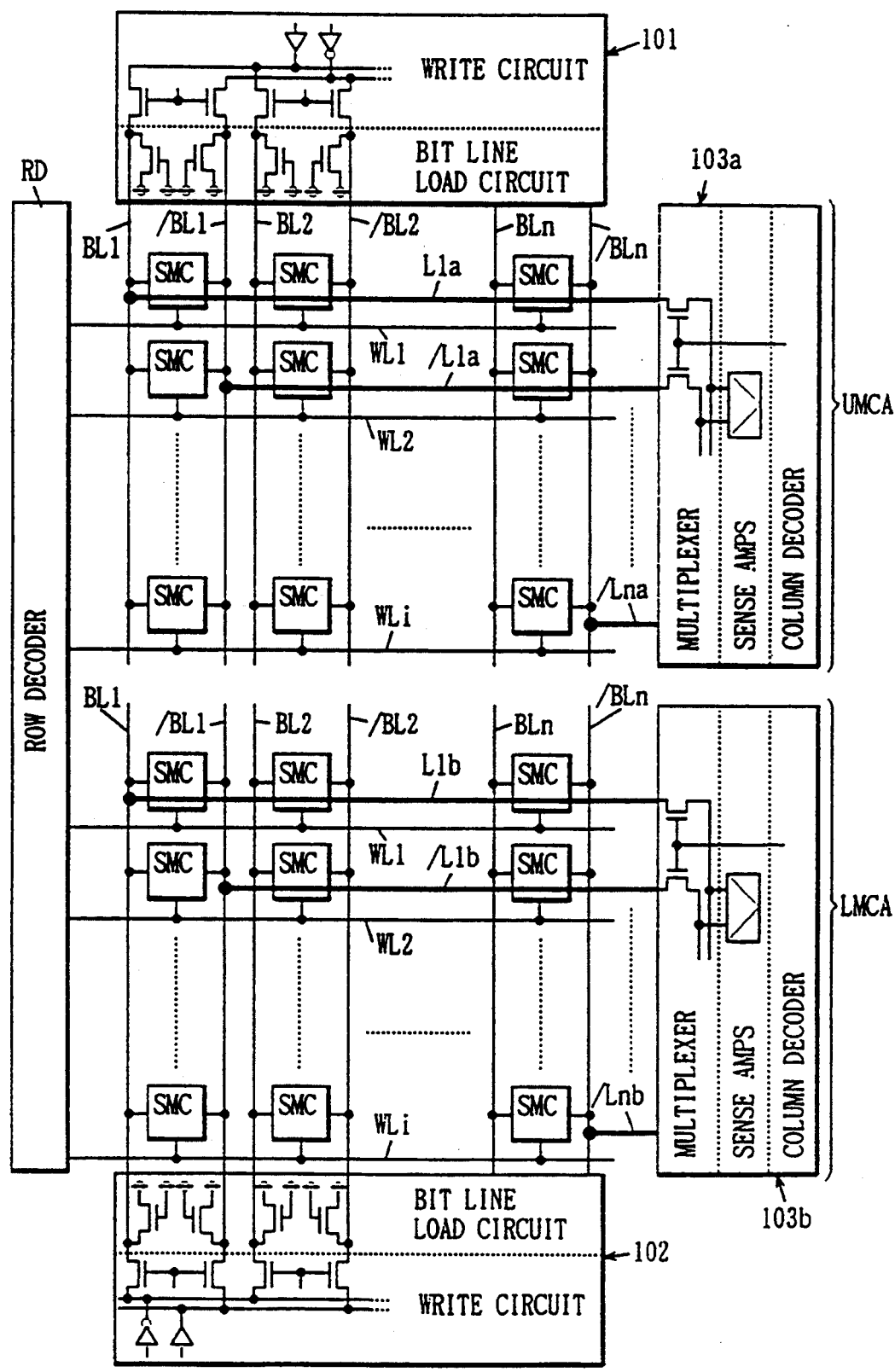
FIG. 22 shows a more specific example shown in detail of the example of FIG. 21.

FIG. 22 is a specific, more detailed example of the embodiment of FIG. 21.

Eighth Embodiment

Figure 23:
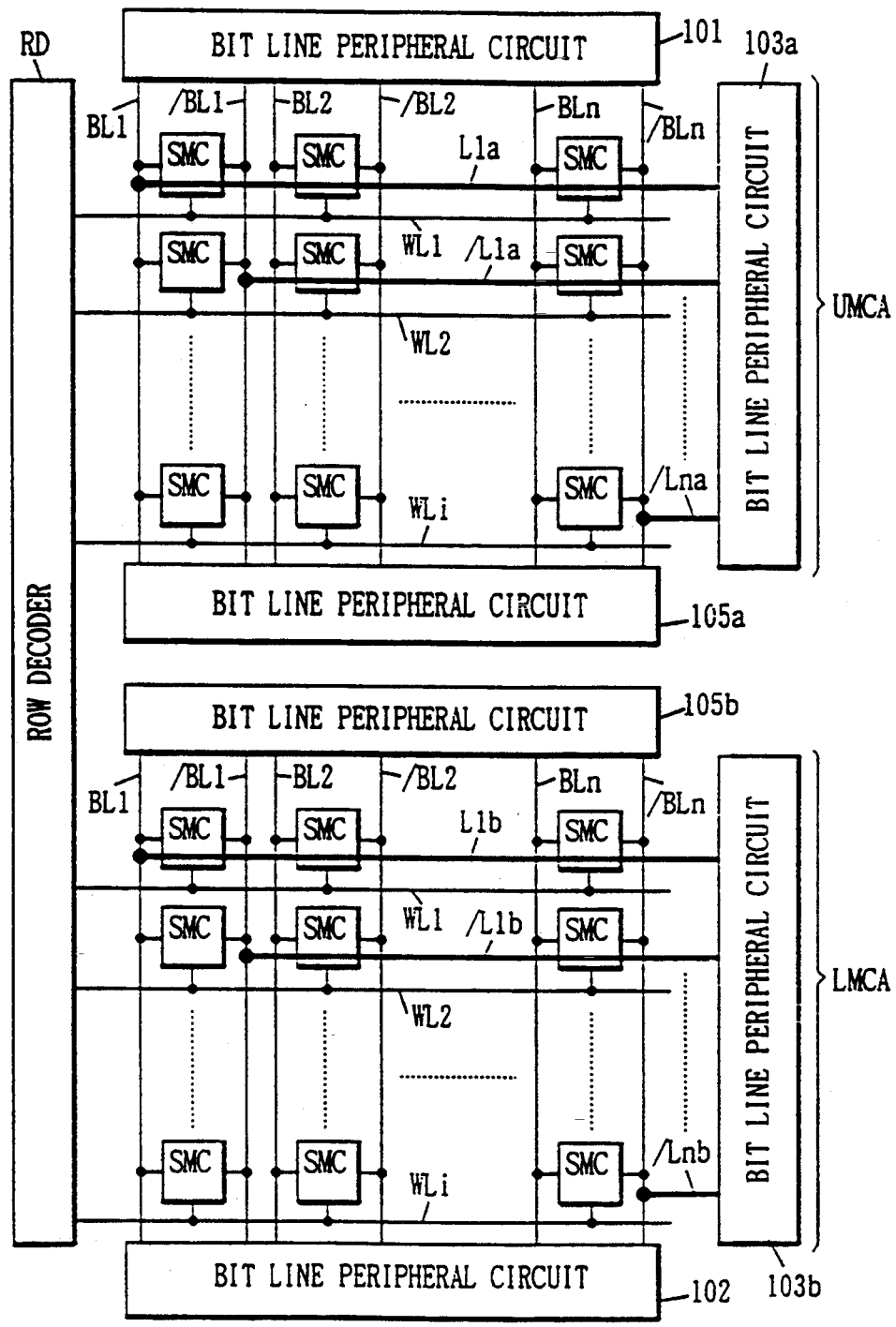
FIG. 23 is a block diagram showing a structure of an eighth embodiment of the present invention.

FIG. 23 is a block diagram illustrating structures of memory cell arrays and peripheral portions of a SRAM of an eighth embodiment of the invention. In the illustrated eighth embodiment, bit line peripheral circuits 105a and 105b are disposed between the divided bit lines in the seventh embodiment in FIG. 21. In this embodiment, the bit line peripheral circuits can be dispersedly arranged at a space or area larger than that in the seventh embodiment in FIG. 21, so that the bit line peripheral circuits can have larger circuit structures.

Figure 24:
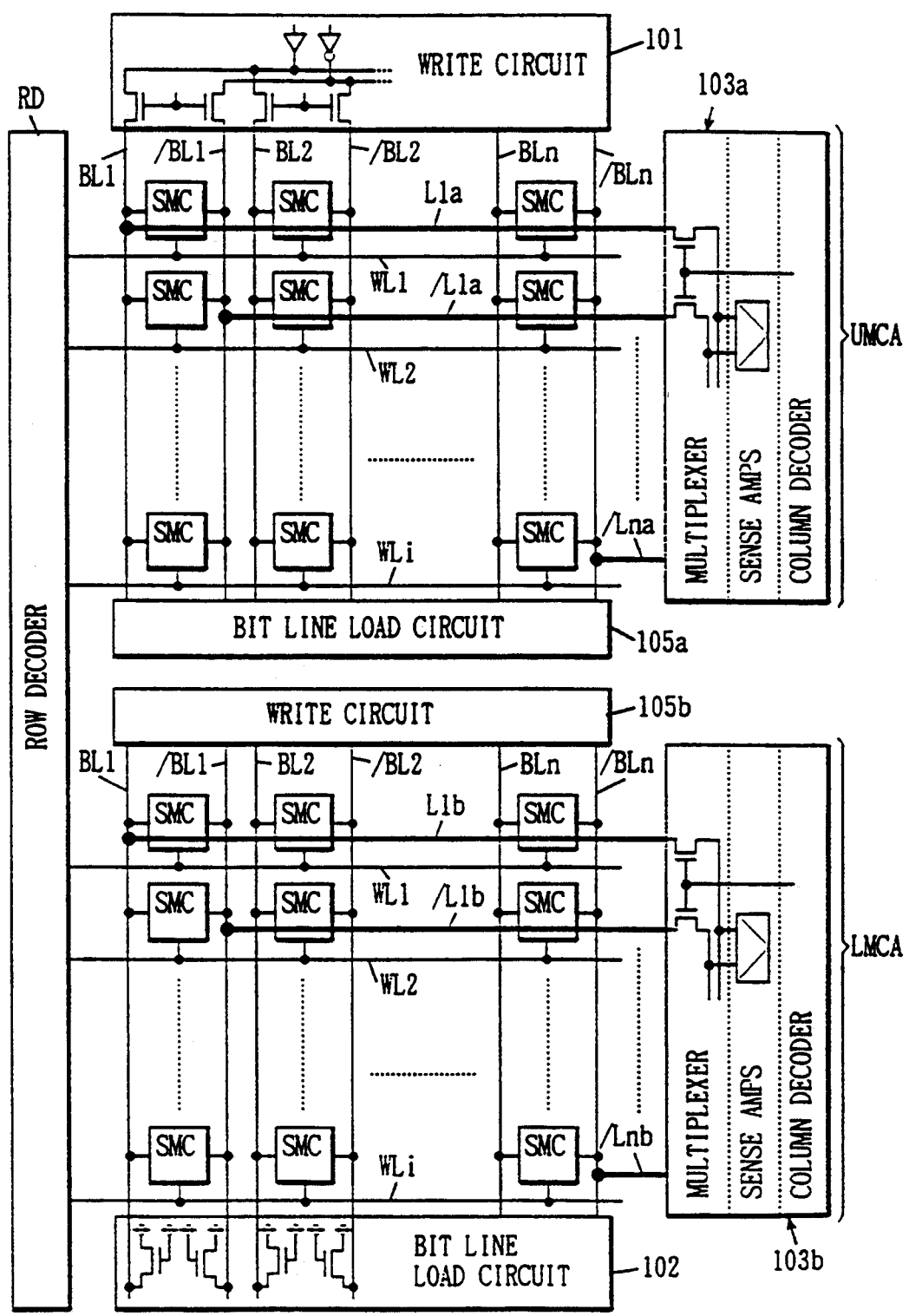
FIG. 24 shows a more specific embodiment shown in detail of the embodiment of FIG. 23.

FIG. 24 is a specific, more detailed example of the embodiment of FIG. 23.

Ninth Embodiment

Figure 25:
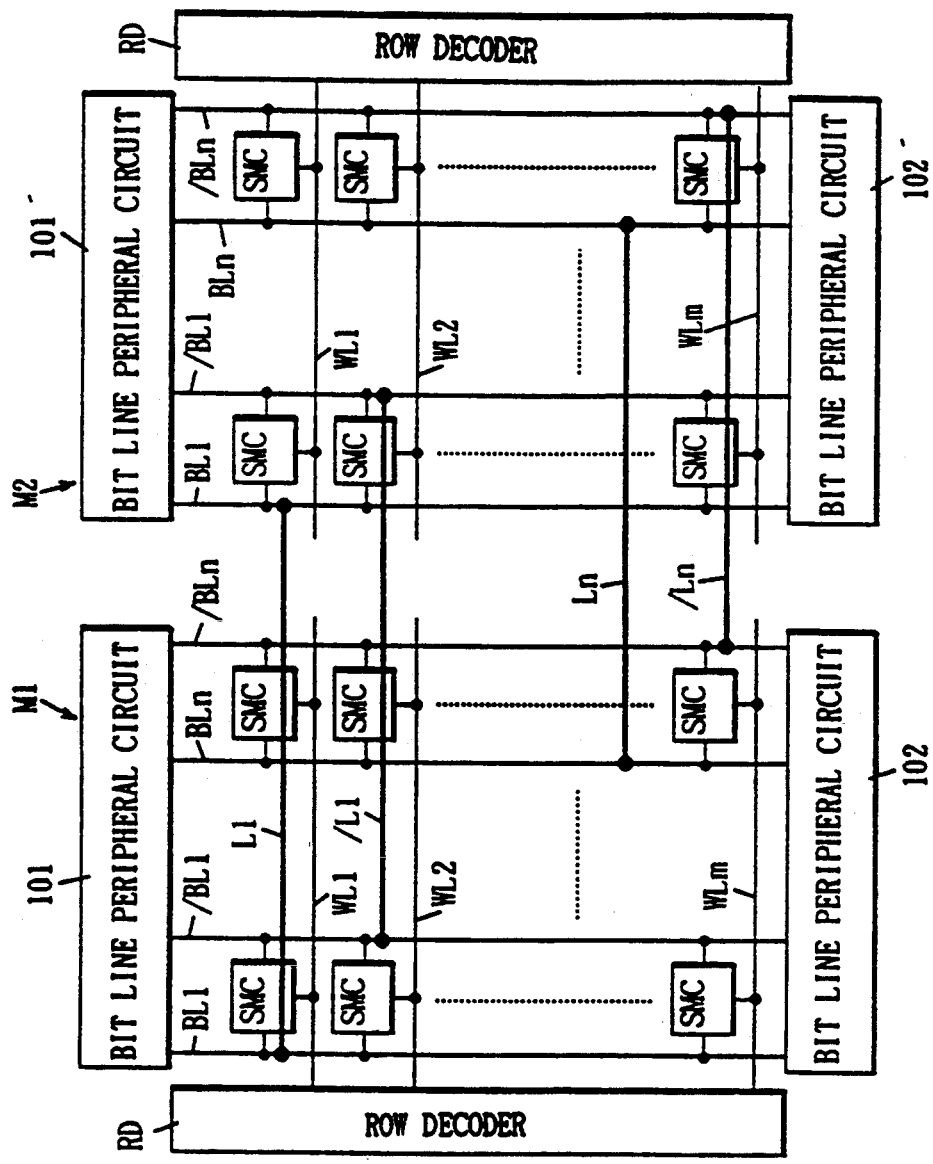
FIG. 25 is a block diagram showing a structure of a ninth embodiment of the present invention.

FIG. 25 is a block diagram illustrating structures of memory cell arrays and peripheral portions of a SRAM of a ninth embodiment of the invention. In the illustrated ninth embodiment, first and second memory cell blocks M1 and M2 are juxtaposed in a direction of the word line. The memory blocks M1 and M2 include memory cell arrays having same structures. The row decoder RD and the bit line peripheral circuits 101 and 102 are provided for the memory cell array in the first memory block Mi. The row decoder RD' and the bit line peripheral circuits 101' and 102' are provided for the memory cell array in the second memory block M2. The bit line peripheral circuits 101 and 101' may have the same or different structures. The line peripheral circuits 102' and 102' also may have the same or different structures. The bit lines BL1, /BL1, ... BLn and /BLn in the first memory block M1 are connected to the corresponding bit lines BL1, /BL1, ... BLn and /BLn in the second memory block M2 through the bit line signal IO lines L1, /L1, ... Ln and /Ln, respectively.

In the ninth embodiment, the corresponding bit lines in the first and second memory blocks M1 and M2 are connected together through the bit line signal IO lines L1, /L1, ... Ln and /Ln, respectively, so that the bit line peripheral circuits 101 and 102 provided for the first memory block 101 can be used also for the second memory block M2, and similarly, the bit line peripheral circuits 101' and 102' provided for the second memory block M2 can be also used for the first memory block M1. Therefore, a space for arranging the bit line peripheral circuits for the respective memory blocks M1 and M2 is substantially increased, and thus a layout of the bit line peripheral circuits having the large structures can be easily achieved.

Figure 26:
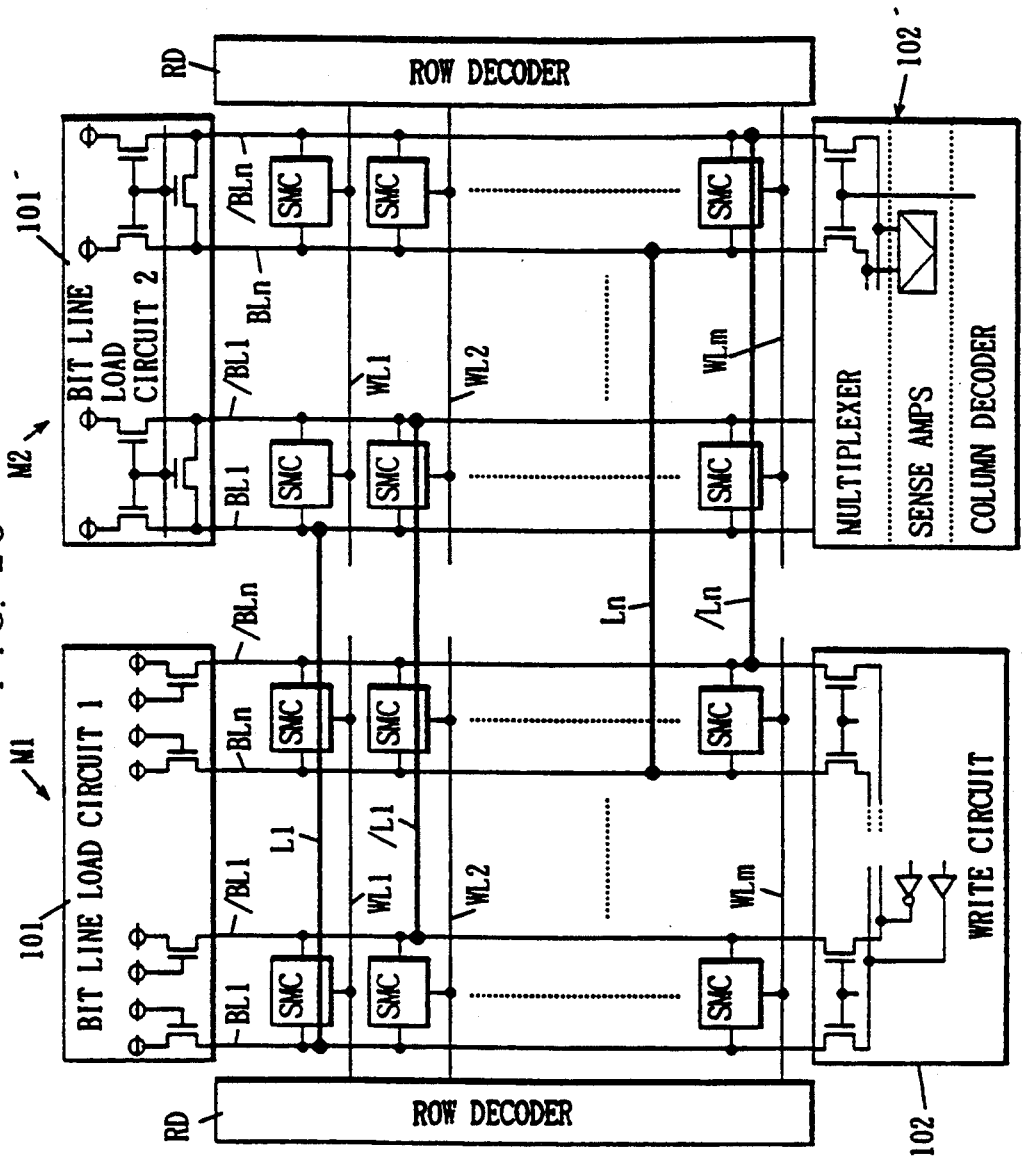
FIG. 26 shows a specific example in more detail of the embodiment shown in FIG. 25.

FIG. 26 is a specific, more detailed example of embodiment of FIG. 25.

Tenth Embodiment

Figure 27:
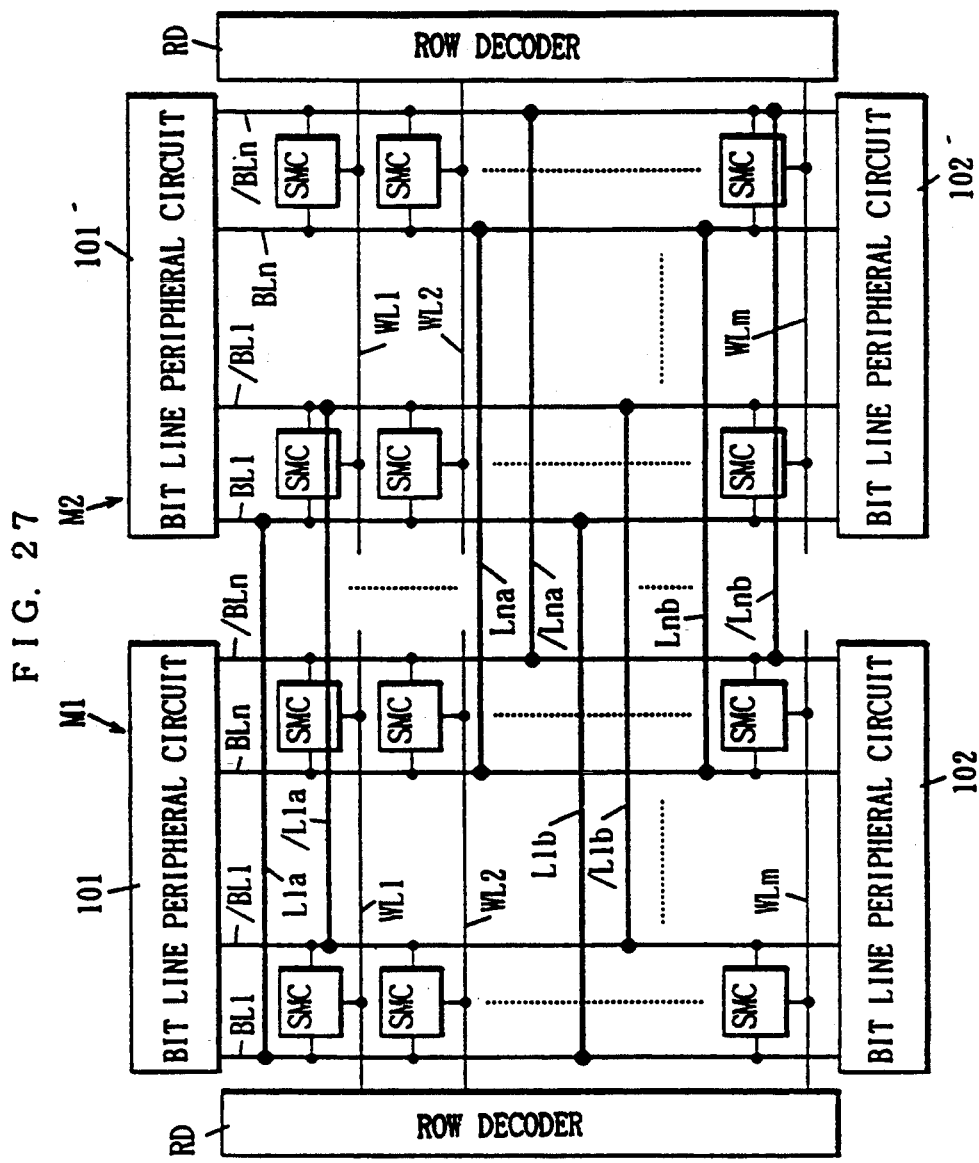
FIG. 27 is a block diagram showing a structure of a tenth embodiment of the present invention.

FIG. 27 is a block diagram illustrating structures of memory cell arrays and peripheral portions of a SRAM of a tenth embodiment of the invention. In the illustrated tenth embodiment, two memory blocks M1 and M2 are juxtaposed in a direction of the word line in a manner similar to the above ninth embodiment in FIG. 25. The bit lines BL1, /BL1, ... BLn and /BLn in the first memory block M1 are connected to the bit lines BL1, /BL1, ... BLn and /BLn in the second memory block M2 through the two sets of bit line signal IO lines, i.e., lines L1a, /L1a ... Lna and /Lna, and lines L1b, /L1b, ... Lnb and /Lnb, respectively. Other structures are same as those in the embodiment in FIG. 25.

The tenth embodiment thus constructed has a following advantage in addition to that obtained in the above ninth embodiment in FIG. 25. The bit lines in the first second memory blocks M1 and M2 are short-circuited to each other by the two sets of bit line signal IO lines, arid thus the bit lines in the first memory block M1 and the bit lines in the second memory block M2 are connected in parallel, so that an effective resistance in each bit line can be reduced. As a result, the bit lines in the memory cell array can transmit the signals at a higher speed, resulting in a higher speed memory operation.

Generally, aluminum having a low resistance is used in wiring of the bit lines. However, in the tenth embodiment, no problem is caused in the operation speed of the memory even if each bit line has a relatively high resistance. Therefore, other material such as polyxide and tungsten may be used for the bit lines, instead of the conventional aluminum. Although the polycide and tungsten have resistances higher than that of the aluminum, minute working thereof is easy, so that they are suitable to the high integration for reducing the chip size.

Figure 28:
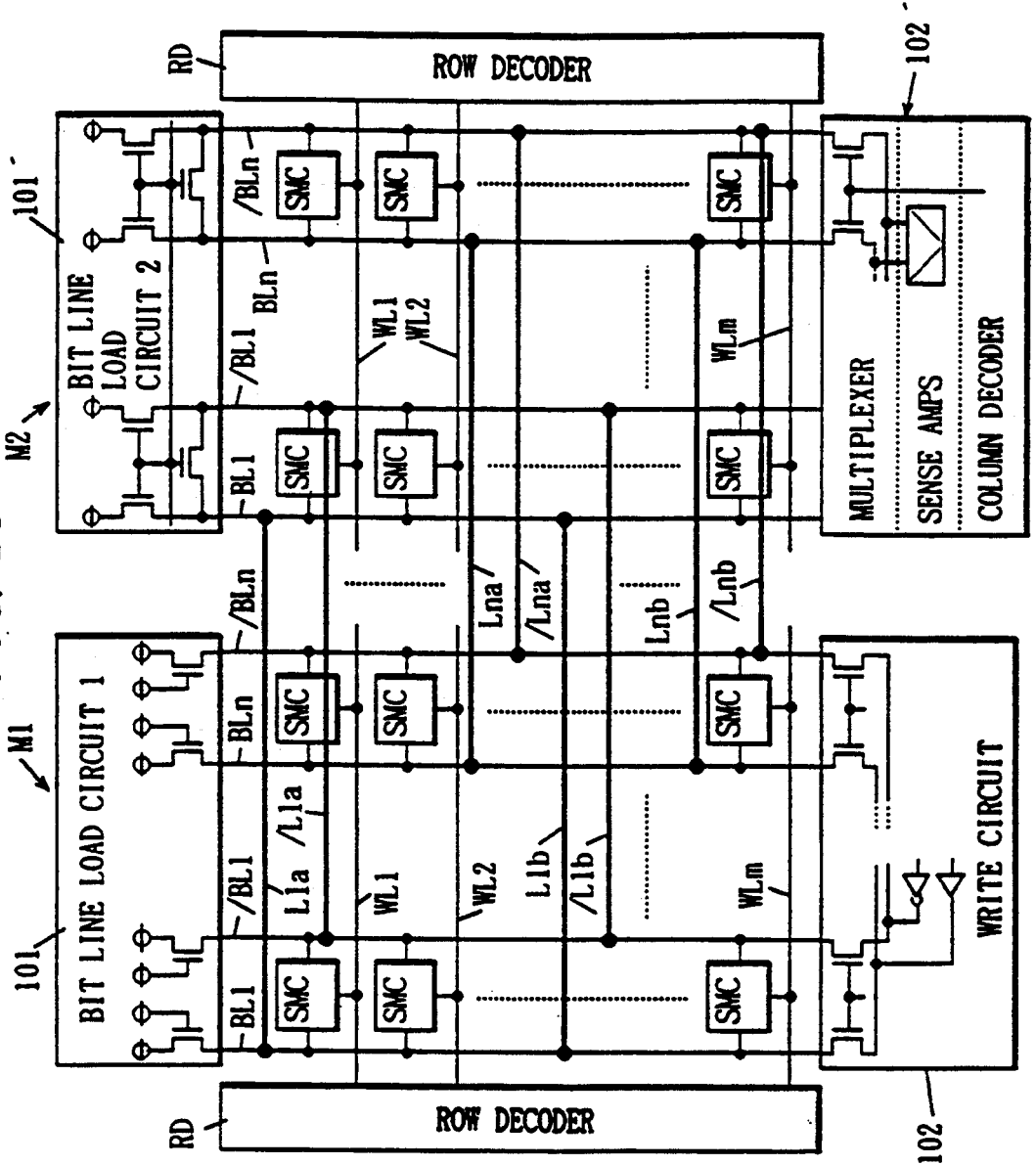
FIG. 28 shows a more specific example shown in detail of the embodiment shown in FIG. 27.

FIG. 28 is a specific, more detailed example of embodiment shown in FIG. 27.

Figure 29:
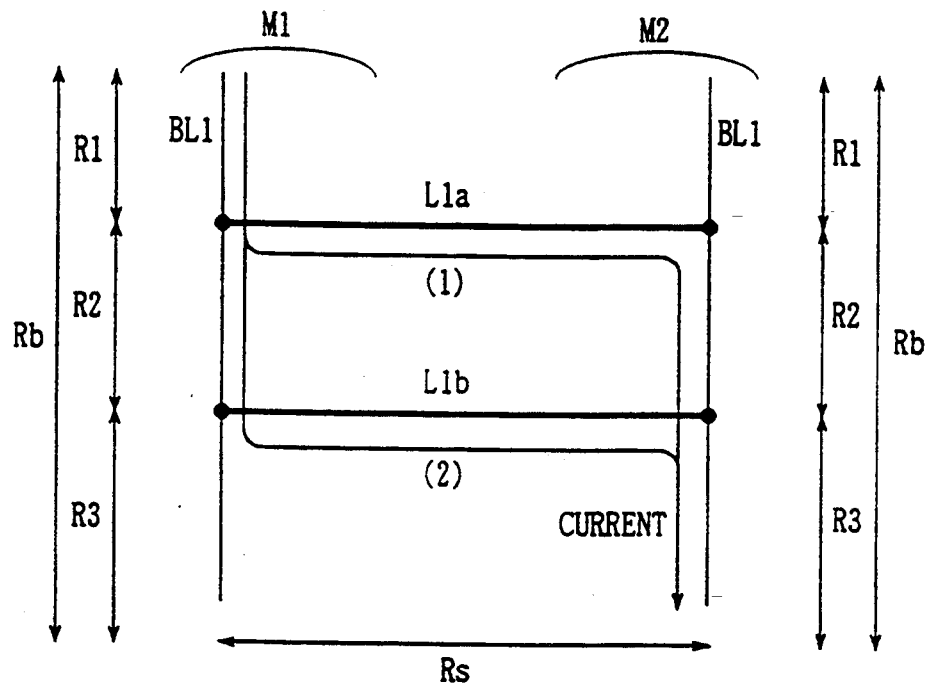
FIG. 29 is a schematic diagram for describing the effect of the embodiment shown in FIG. 28.

As described above, in the tenth embodiment, resistance of each bit line can be reduced. The reason will be described in detail in the following. As an example, let us assume that current flows from the bit line load circuit 101 of the first memory block M1 of FIG. 28 to the sense amplifier group 102' of the second memory block M2 through the bit line BL1. In this case, there are two current paths, namely, (1) and (2), as shown in FIG. 29. Namely, in the first current path (1), the current flows from the bit line BL1 of the first memory block M1 through the bit line signal IO line L1a to the bit line BL1 of the second memory block M2. In the second current path (2), current flows from the bit line BL1 of the first memory block M1 through the bit line signal IO line L1b to the bit line BL1 of the second memory block M2. Now, when the resistance value of the bit line BL1 on the upper side of the bit line signal IO line L1a is represented by R1, the resistance value of the bit line BL1 between the bit line signal IO line L1a and the bit line signal IO line L1b is represented by R2, the resistance value of the bit line BL1 on the lower side of the bit line signal IO line L1b is represented by R3 and the resistance value of the bit line signal IO line L1a or L1b is represented by Rs, an equivalent circuit of FIG. 29 is as shown in FIG. 30.

Figure 30:
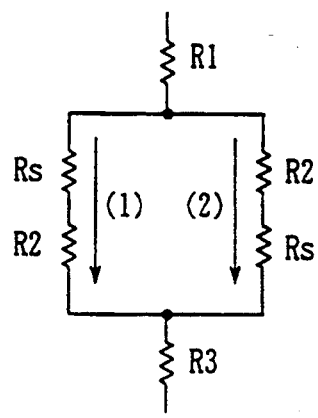
FIG. 30 is an equivalent circuit diagram of the current path shown in FIG. 29.

The combined resistance R of the equivalent circuit shown in FIG. 30 will be:

$$R = R1 + [1/\{1/(Rs + R2) + 1/(R2 + Rs)\}] + R3$$
$$= R1 + R3\{(Rs + R2)/2\}$$
$$= (Rb - R2)/2\}$$

In the above equation, $Rb = R1 + R2 + R3$. As is understood from this equation, the value of the combined resistance R changes dependent on the value of the resistance R2, that is, the space between the bit line signal IO lines L1a and L1b. Namely, the space between the two bit line signal IO lines connected to the corresponding bit lines should preferably be the same for respective bit lines, so as to reduce variation among resistances of the respective bit lines.

Figure 31:
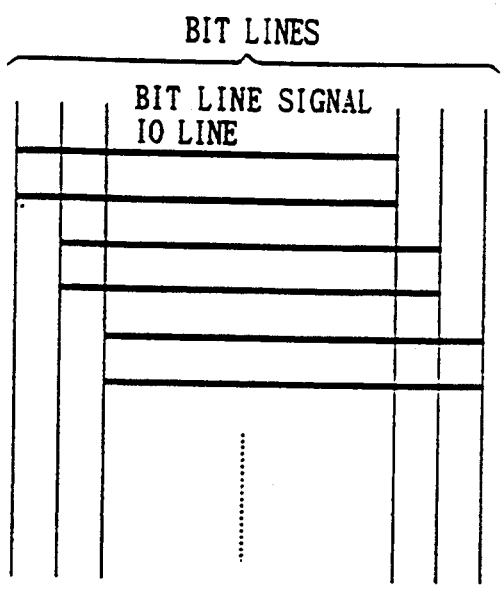
FIG. 31 is a schematic diagram showing another example of an arrangement of the bit line signal IO lines.
Figure 32:
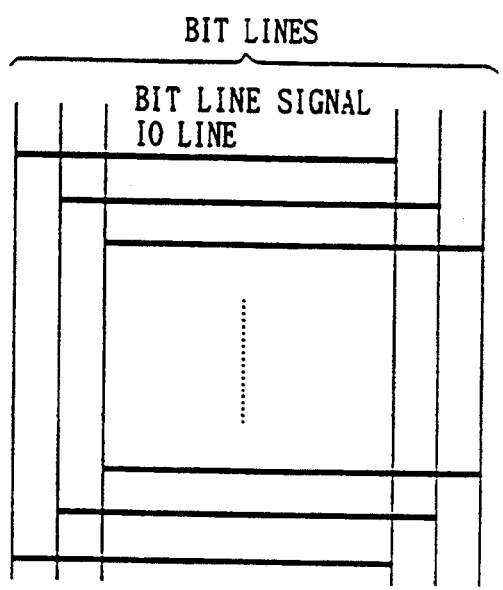
FIG. 32 is a schematic diagram showing a further example of the arrangement of the bit line IO lines.

The bit line signal IO lines may be arranged as shown in FIG. 31 or 32. However, in the example of FIG. 32, the resistances of the bit lines are not uniform.

Eleventh Embodiment

Figure 33:
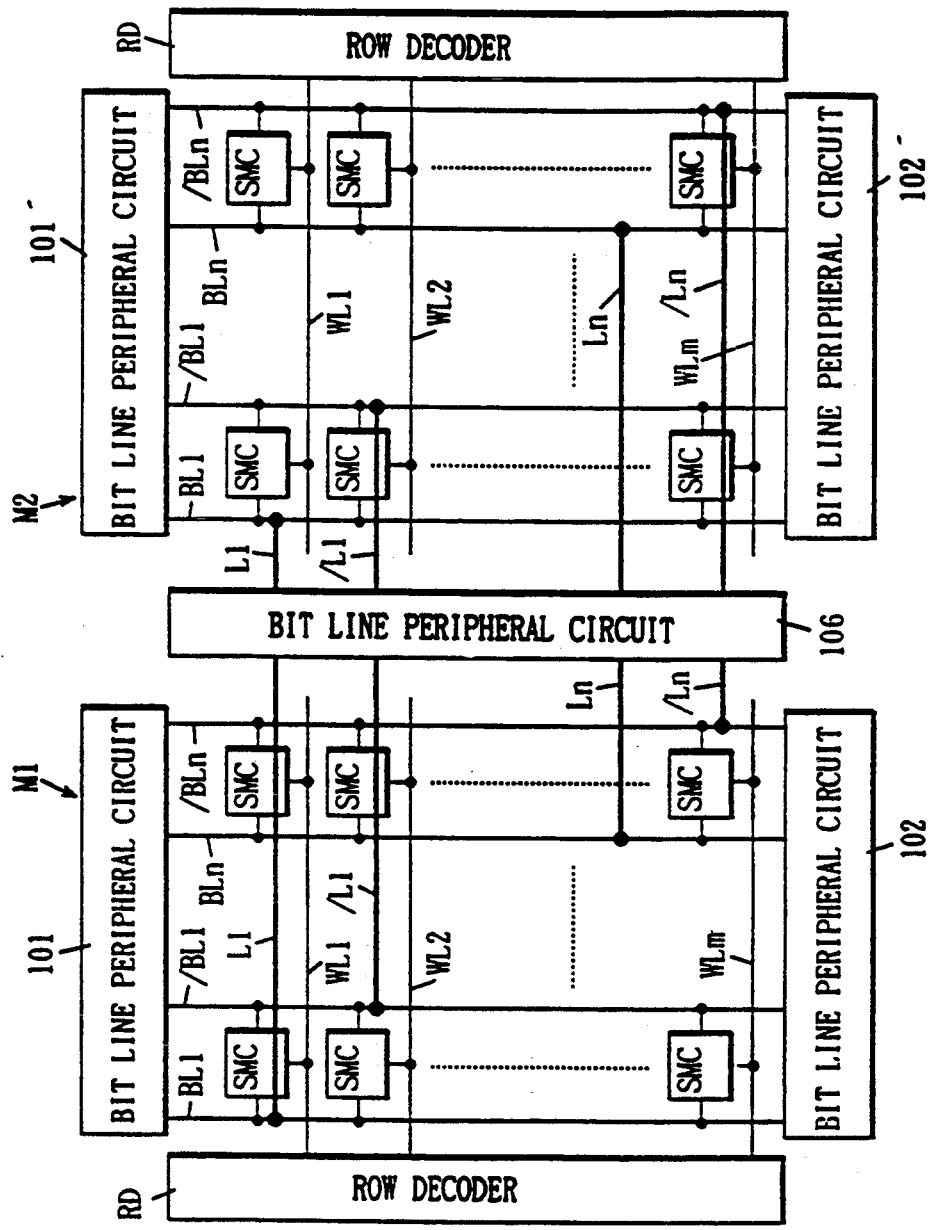
FIG. 33 is a block diagram showing a structure of an eleventh embodiment of the present invention.

FIG. 33 is a block diagram illustrating structures of memory cell arrays and peripheral portions of a SRAM of an eleventh the embodiment of the invention. In the illustrated eleventh embodiment, a bit line peripheral circuit 106 is arranged between the first and second memory blocks M1 and M2. Other structures are same as those in the ninth embodiment in FIG. 25.

This eleventh embodiment has the same advantage as that by the above embodiment in FIG. 25, and also can increase the space for arranging the bit line peripheral circuits, which allows the layout of the bit line peripheral circuits having still larger structures. Further, since the bit line peripheral circuit 106 functions for both the first and second memory blocks M1 and M2, the chip size can be reduced.

Figure 34:
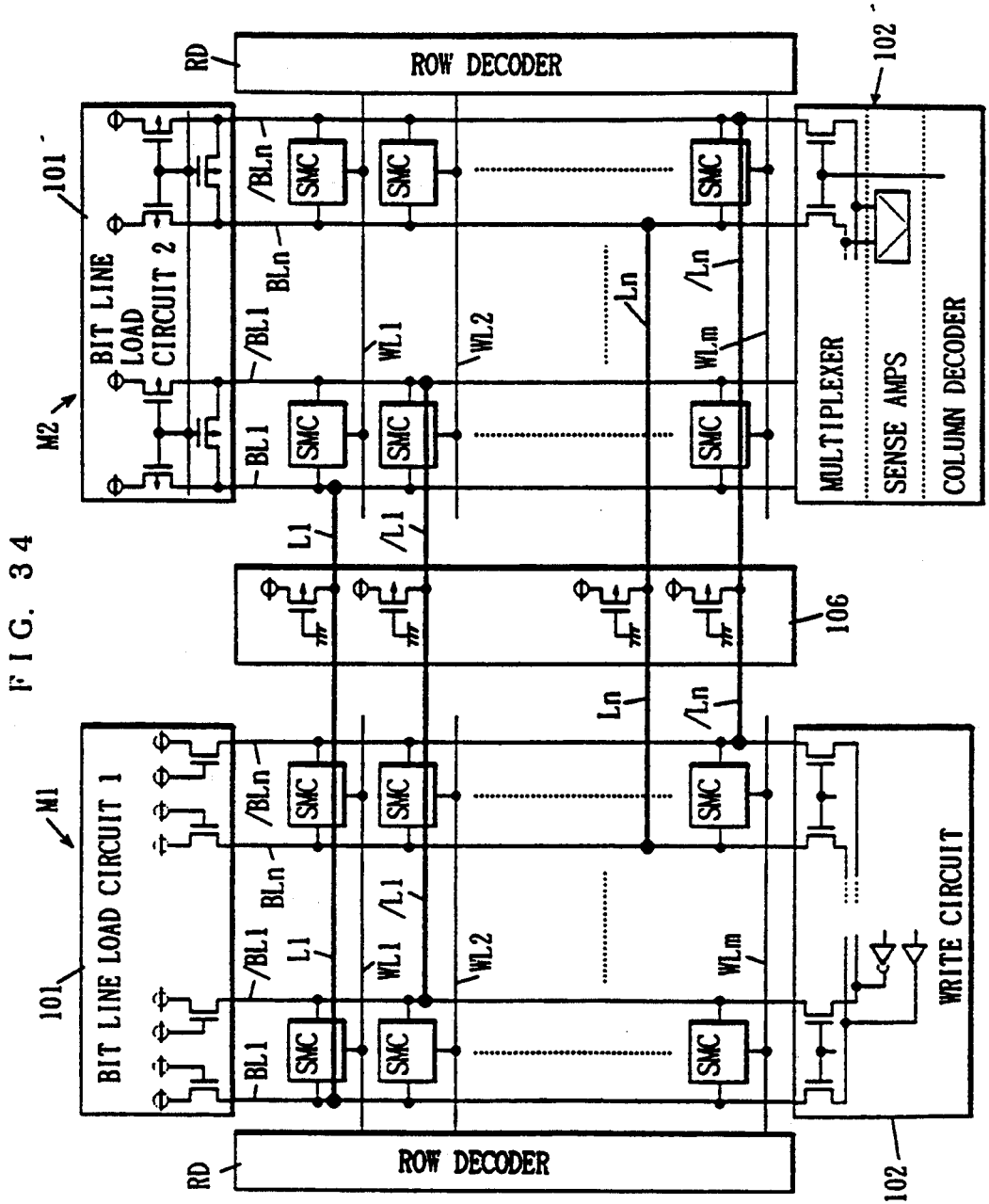
FIG. 34 shows a more specific example shown in more detail of the embodiment of FIG. 33.

FIG. 34 is a specific, more detailed example of the embodiment shown in FIG. 33.

Twelfth Embodiment

Figure 35:
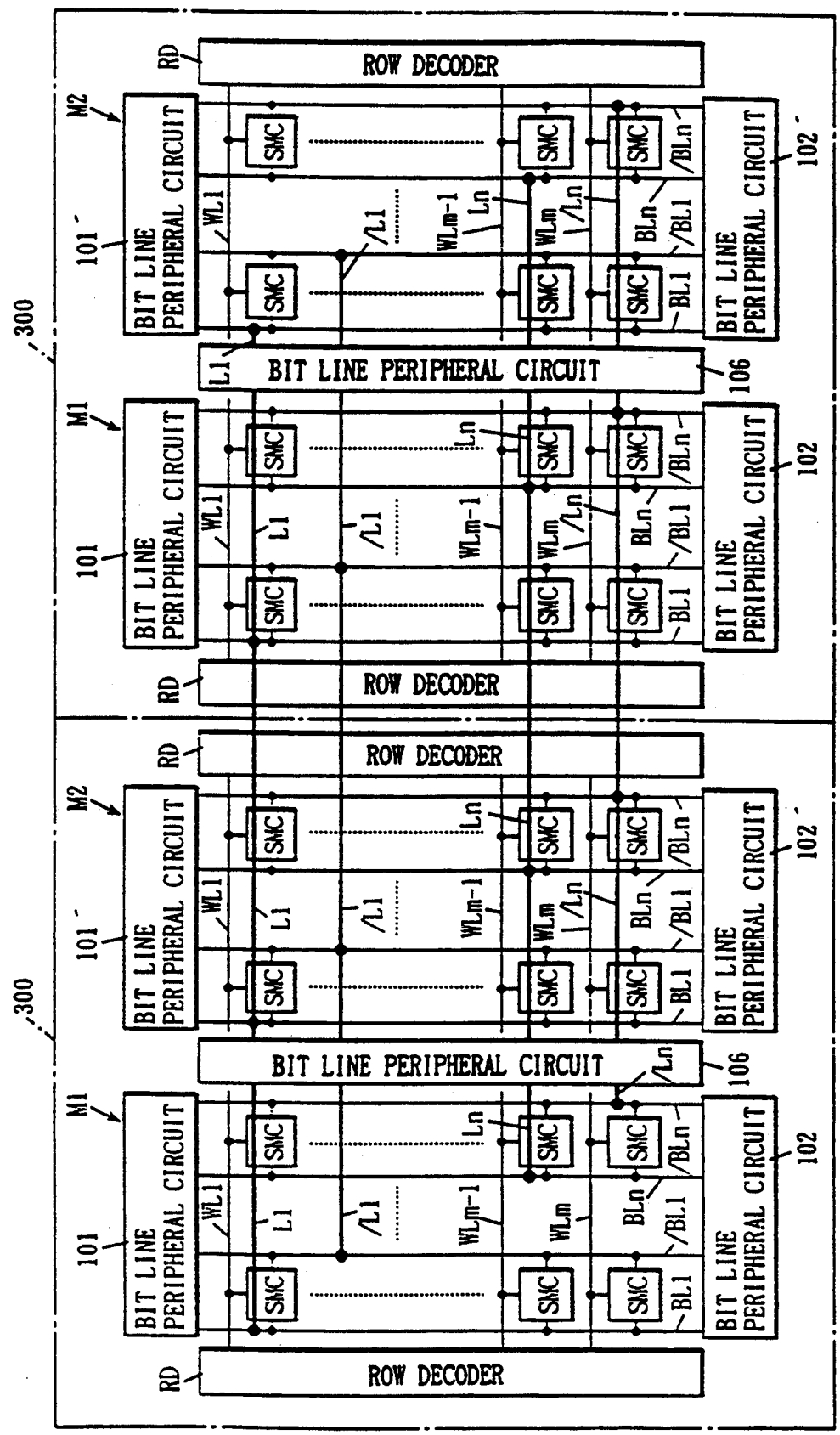
FIG. 35 is a block diagram showing a structure of a twelfth embodiment of the present invention.

FIG. 35 is a block diagram illustrating structures of memory cell arrays and peripheral portions of a SRAM of a twelfth embodiment of the invention. In the illustrated twelfth embodiment, two memory circuits 300, each of which has the same structures as those in the eleventh embodiment in FIG. 33, are juxtaposed in a direction of the word line. Further, the bit lines BL1, /BL1, ... BLn and /BLn of the memory blocks M1 and M2 in the memory circuit 300 arranged at the left are connected to the bit lines BL1, /BL1, ... BLn and /BLn of the memory blocks M1 and M2 in the memory circuit 300 arranged at the right through the bit line signal IO lines L1, /L1, ... Ln and /Ln.

In the twelfth embodiment, the corresponding bit lines in the four memory blocks are connected together by the bit line signal IO lines, so that each memory block can use still more bit line peripheral circuits that the embodiment in FIG. 33, and thus the layout of the bit line peripheral circuit can be determined more easily.

The internal structure of the bit line peripheral circuit 106 in FIG. 35 may be the same as that of the bit line peripheral circuit 106 of FIG. 34.

Thirteenth Embodiment

Figure 36:
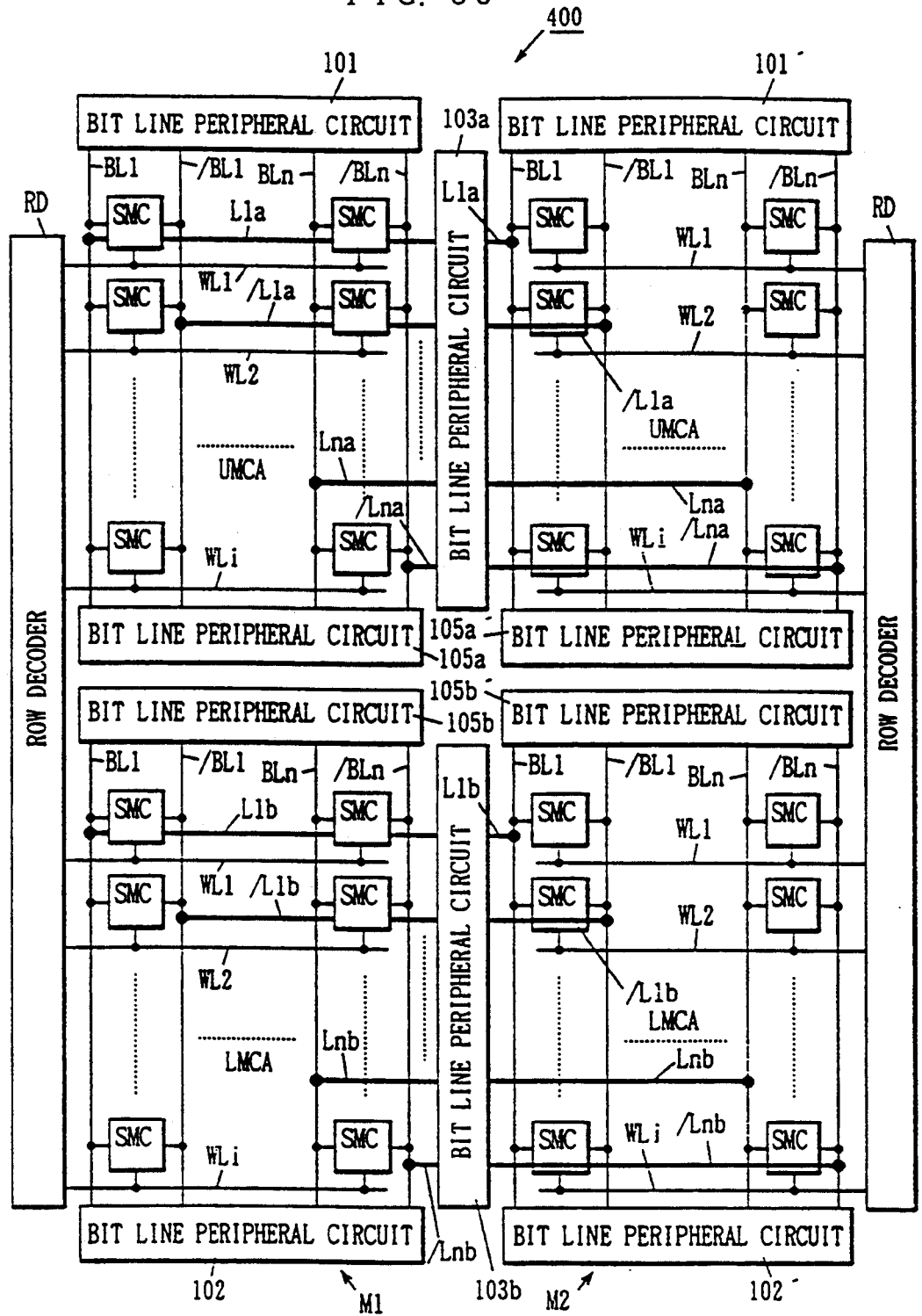
FIG. 36 is a block diagram showing a structure of a thirteenth embodiment of the present invention.

FIG. 36 is a block diagram illustrating structures of memory cell arrays and peripheral portions of a SRAM of a thirteenth embodiment of the invention. The illustrated thirteenth embodiment is a combination of the eighth embodiment in FIG. 23 and the eleventh embodiment in FIG. 33 stated previously. That is, the two memory blocks M1 and M2, each of which includes the upper and lower memory cell arrays UMSA and LMSA divided from each other, are juxtaposed in the direction of the word line, and the corresponding bit lines in the two memory blocks are connected together through the bit line signal IO lines.

Fourteenth Embodiment

FIG. 37 is a block diagram illustrating structures of memory cell arrays and peripheral portions of a SRAM of a fourteenth embodiment of the invention. In the illustrated fourteenth embodiment, two memory circuits 400, each of which has the same structures as that in the thirteenth embodiment in FIG. 36, are juxtaposed in the direction of the word line, and the corresponding bit lines in the two memory cell circuits 400 are connected together by the bit line signal IO lines.

Fifteenth Embodiment

Figure 38:
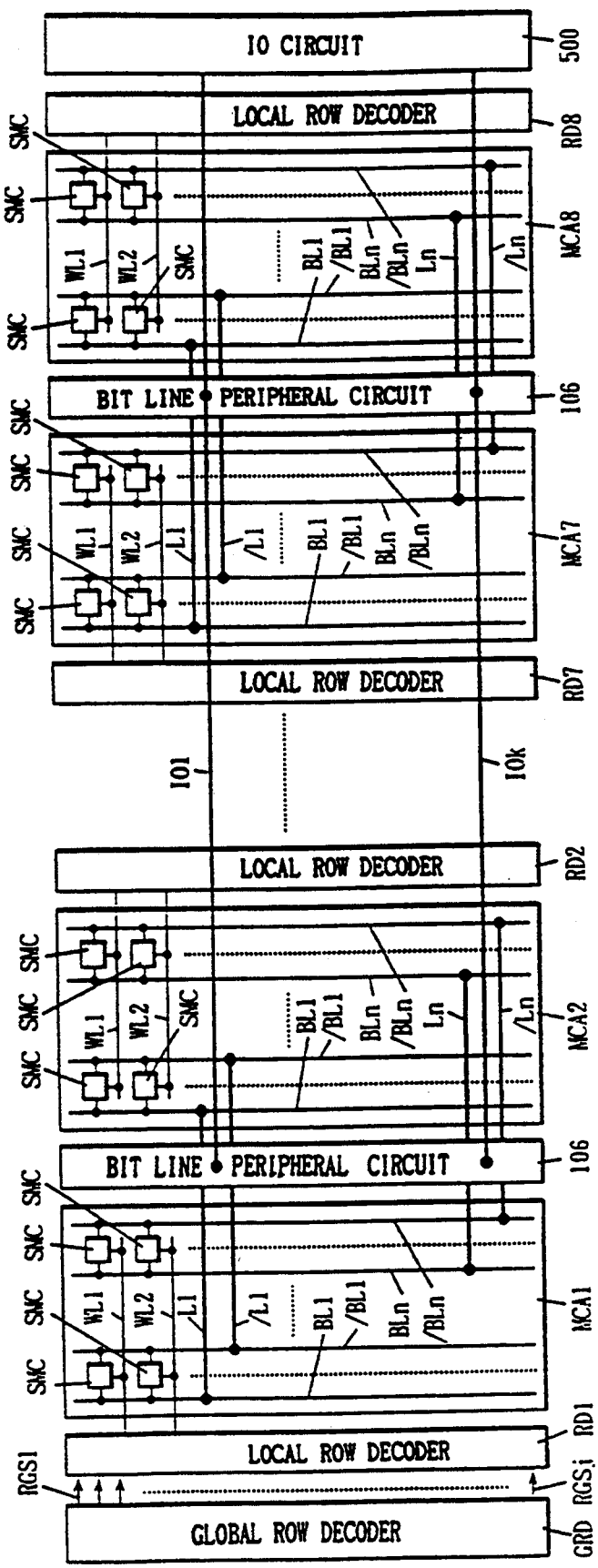
FIG. 38 is a block diagram showing a structure of a fifteenth embodiment of the present invention.

FIG. 38 is a block diagram illustrating structures of memory cell arrays and peripheral portions of a SRAM of a fifteenth embodiment of the invention. This illustrated fifteenth embodiment is an example in which the present invention is applied to a memory having a so-called divided word line structure. In the figure, this SRAM has a plurality of (8 in FIG. 38) divided memory cell arrays MCA1-MCA8. Local row decoders RD1-RD8 are provided for the memory cell arrays MCA1—MCA8, respectively. One common global row decoder GRD is provided for the whole memory cell arrays MCA1-MCA8. The global row decoder GRD receives a signal of upper several bits out of the external row address data, and signals of the remaining bits are applied to the local row decoders RD1-RD8. Further, the local row decoders RD1-RD8 receive external local row decoder selection signals. In each of the memory cell arrays MCA1-MCA8, the word lines WL1-WLm are divided into several groups, each of which includes a predetermined number of the word lines. The global row decoder GRD decodes the applied row address signals to output signals for selecting one row group among said row groups. The row group selection signals outputted from the global row decoder GRD is applied through row group selection signal lines RGS1-RGSj to the local row decoders RD1-RD8. The local row decoders RD1-RD8 decode the row address signals and the row group selection signals to select one word line in the row group selected by the global row decoder GRD. Since the local row decoder selection signals selectively activate only one of the local row decoders RD1-RD8, only one word line in one memory cell array will be selected in practice. The structures which have been described above are the same as conventional memories having the divided word line structures in the prior art. The memory having the divided word line structures is disclosed more specifically in the following references. The general divided word line structure is disclosed in U.S. Pat. No. 4,542,486 and "A Divided Word Line Structure in the Static RAM and its Application to a 64K Full CMOS RAM" (IEEE Journal of Solid-State Circuits, Vol. SC-18, October 1983, pp 479–485). A modified divided word line structure using a row group selection method is disclosed in an article "A 14-ns 1Mbit CMOS SRAM with Variable Bit Organization" (IEEE Journal of Solid-State Circuits, Vol. 23, No. 5, October 1988, pp. 1060–1066). Further, "Hierarchical Word Decoding Architecture (HWD)" having a hierarchical divided word line structure is disclosed in an article "A 20-ns 4Mb CMOS SRAM with Hierarchical Word Decoding Architecture" (1990 IEEE International Solid-State Circuit Conference, p. 132).

In FIG. 38, the memory cell arrays MCA1–MCA8 each are provided with the bit lines BL1, /BL1, ... BLn and /BLn and the corresponding bit line signal IO lines L1, /L1, ... Ln and /Ln. The bit line peripheral circuits 106 are arranged between every other memory cell arrays MCA1–MCA8. Each bit line peripheral circuit 106 is coupled to the bit line signal IO lines L1, /L1, ... Ln and /Ln in the adjacent memory cell arrays on both sides thereof. Thus, each bit line peripheral circuit 106 is commonly used by the adjacent two memory cell arrays. The respective bit line peripheral circuits 106 are connected through IO lines IO1-IOk to an IO circuit 500 including an IO buffer and others. The IO circuit 500 is adapted to apply the externally input write data and control data, to the respective bit line peripheral circuits 106, and is also adapted to output the read data and the like, which are applied from the respective bit line peripheral circuits 106, from the SRAM chip. The IO lines IO1-IOk are disposed parallel to the word lines WL1-WLm, bit line signal IO lines L1, /L1, ... Ln and /Ln and row group selection signal lines RGS1-RGSj. Therefore, the IO lines IO1-IOk do not cross the word lines, bit line signal IO lines and the row group selection signal lines, and thus can be formed in the same wiring layer. Accordingly, a wiring process for the IO lines IO1-IOk can be made simple. Further, since the IO lines IO1-IOk can be disposed to pass over the memory cell arrays MCA1–MCA8, the chip size can be reduced, as compared with the conventional structures having the lines or wires arranged outside the memory cell arrays.

In the embodiment in FIG. 38, the bit line peripheral circuits may be arranged at upper and lower ends of the bit lines.

Figure 39:
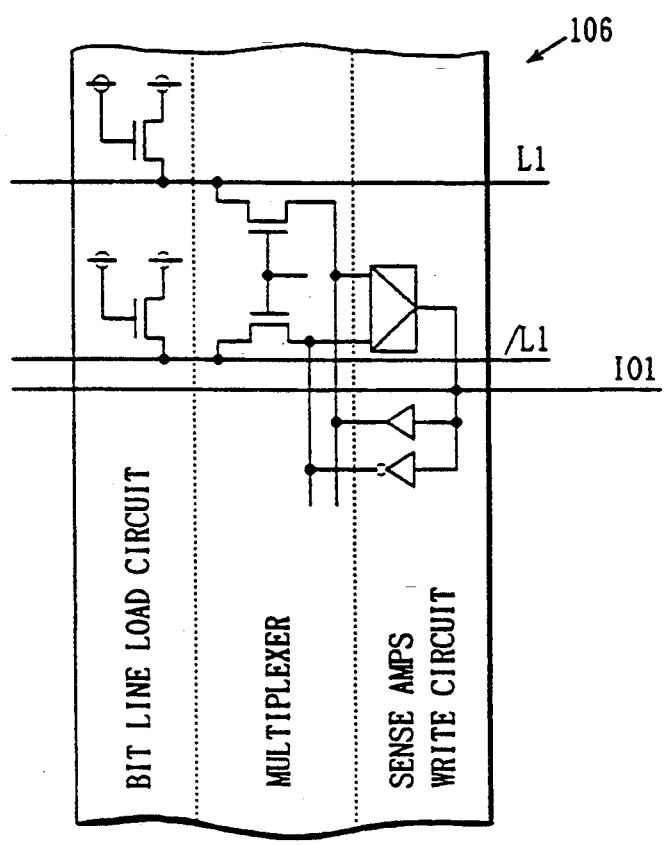
FIG. 39 shows an example of a structure of the bit line peripheral circuits in the embodiment shown in FIG. 38.

FIG. 39 is a specific example of the bit line peripheral circuit of FIG. 38.

Sixteenth Embodiment

Figure 40:
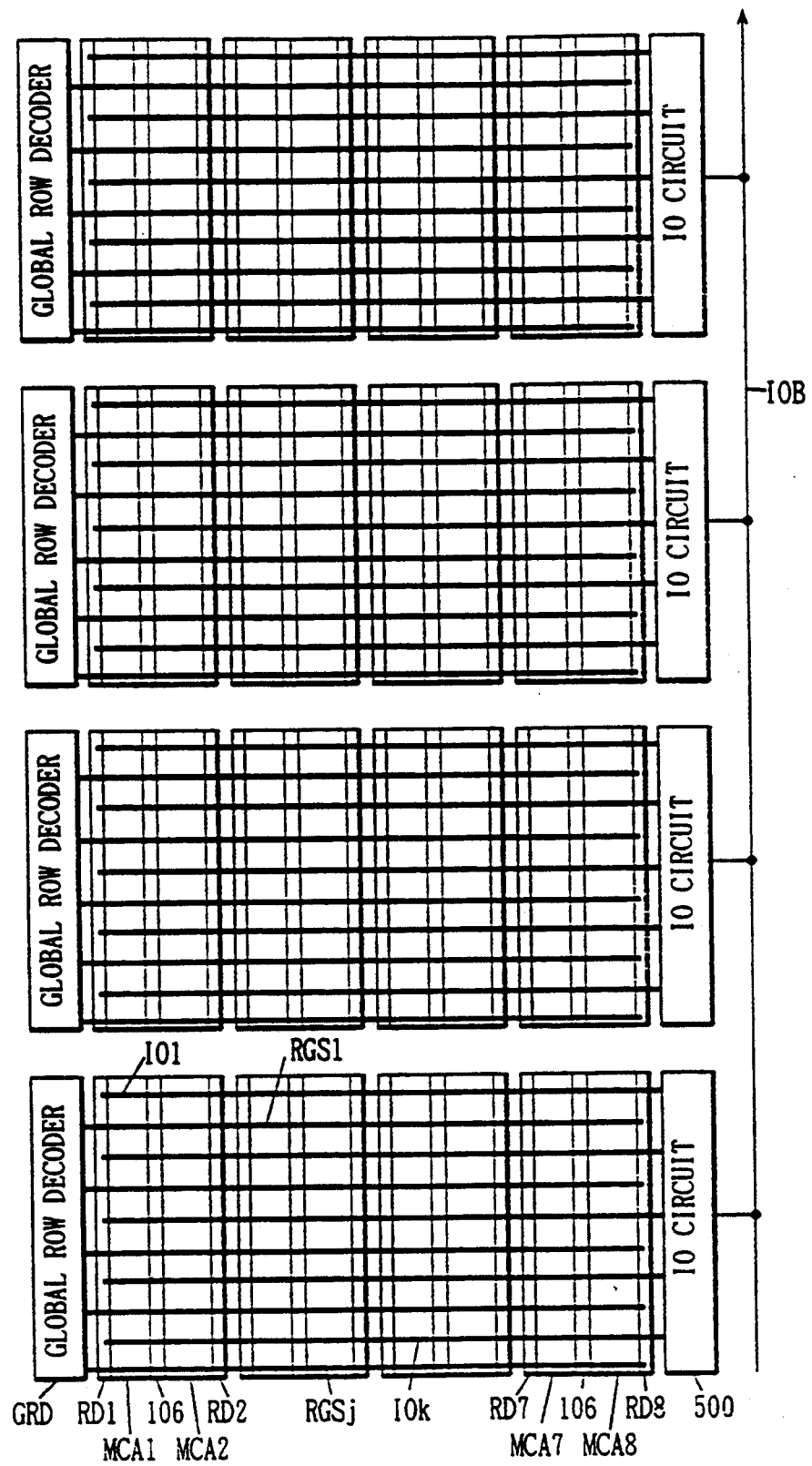
FIG. 40 is a block diagram showing a structure of a sixteenth embodiment of the present invention.

FIG. 40 is a block diagram illustrating structures of memory cell arrays and peripheral portions of a SRAM of a sixteenth embodiment of the invention. The illustrated sixteenth embodiment includes a plurality of (four in FIG. 40) memories, which have the divided word line structures shown in FIG. 38, juxtaposed in the direction of the bit line. The IO circuits 500 for the memories are connected to IO pins, not shown, through IO data buses IOB.

Seventeenth Embodiment

Figure 41:
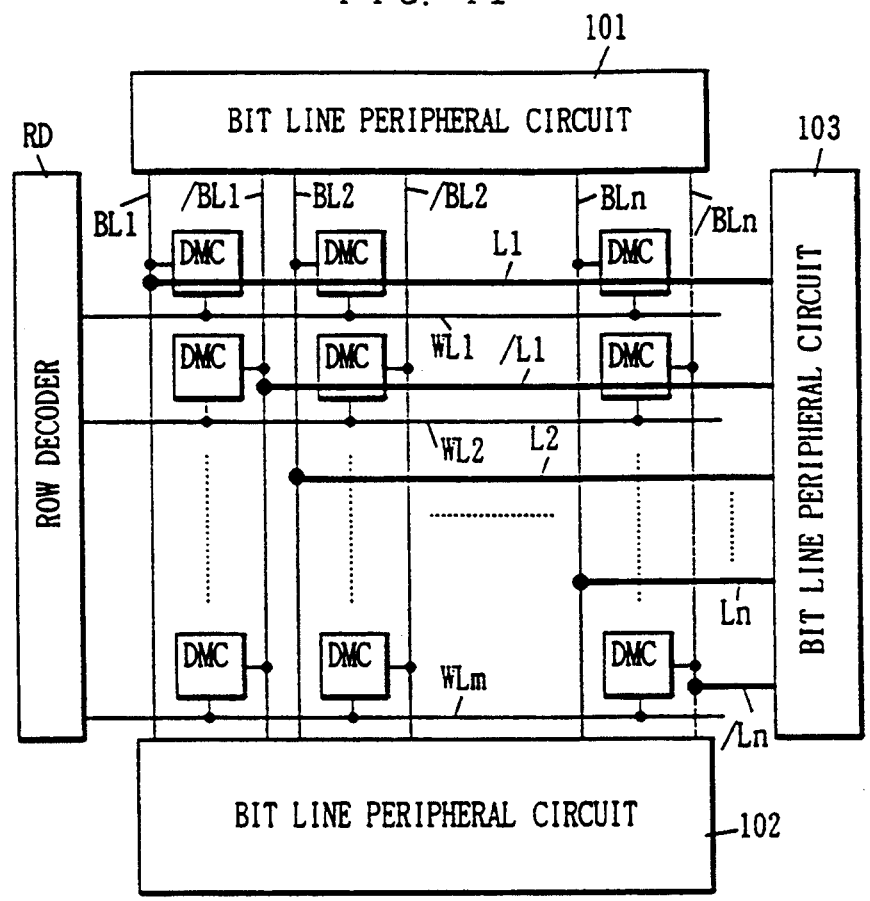
FIG. 41 is a block diagram showing a structure of a seventeenth embodiment of the present invention.
Figure 42:
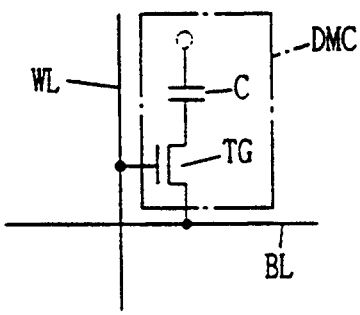
FIG. 42 is a circuit diagram showing an example of a dynamic memory cell structure employed in the embodiment shown in FIG. 41.

FIG. 41 is a block diagram illustrating structures of memory cell arrays and peripheral portions a SRAM of a seventeenth embodiment of the invention. In the illustrated seventeenth embodiment, dynamic memory cells DMC having such structures as shown in FIG. 42 are disposed at crossings of the word lines WL1-/WLm and the bit line pairs BL1, /BL1, ... BLn and /BLn. The dynamic memory cell DMC in FIG. 42 includes a memory capacitor C and a transfer gate transistor TG. Other structures of DRAMs shown in FIG. 41 are the same as those in the first embodiment in FIG. 1.

Figure 43:
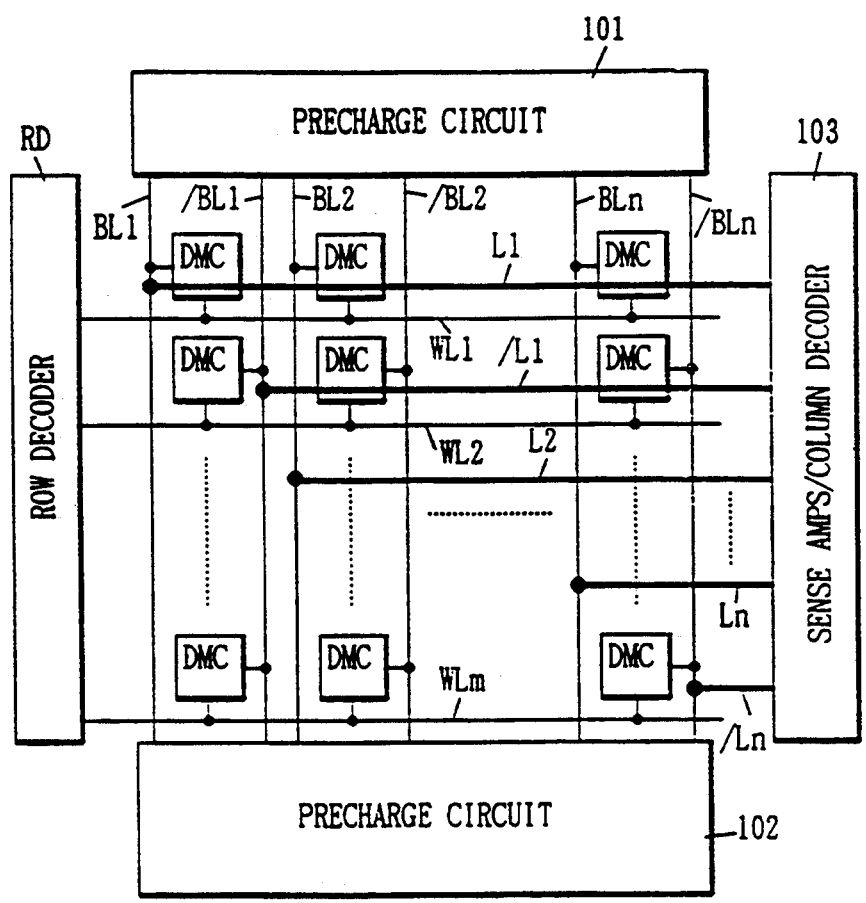
FIG. 43 is a block diagram showing an example of a dispersed arrangement of the various bit line peripheral circuits of the embodiment shown in FIG. 41.

FIG. 43 illustrates an example of dispersed arrangement of bit line peripheral circuits in an embodiment in FIG. 41. In FIG. 43, the bit line peripheral circuits 101 and 102 include precharge circuits, respectively. The bit line peripheral circuit 103 includes the sense amplifier group and the column decoder.

Figure 44:
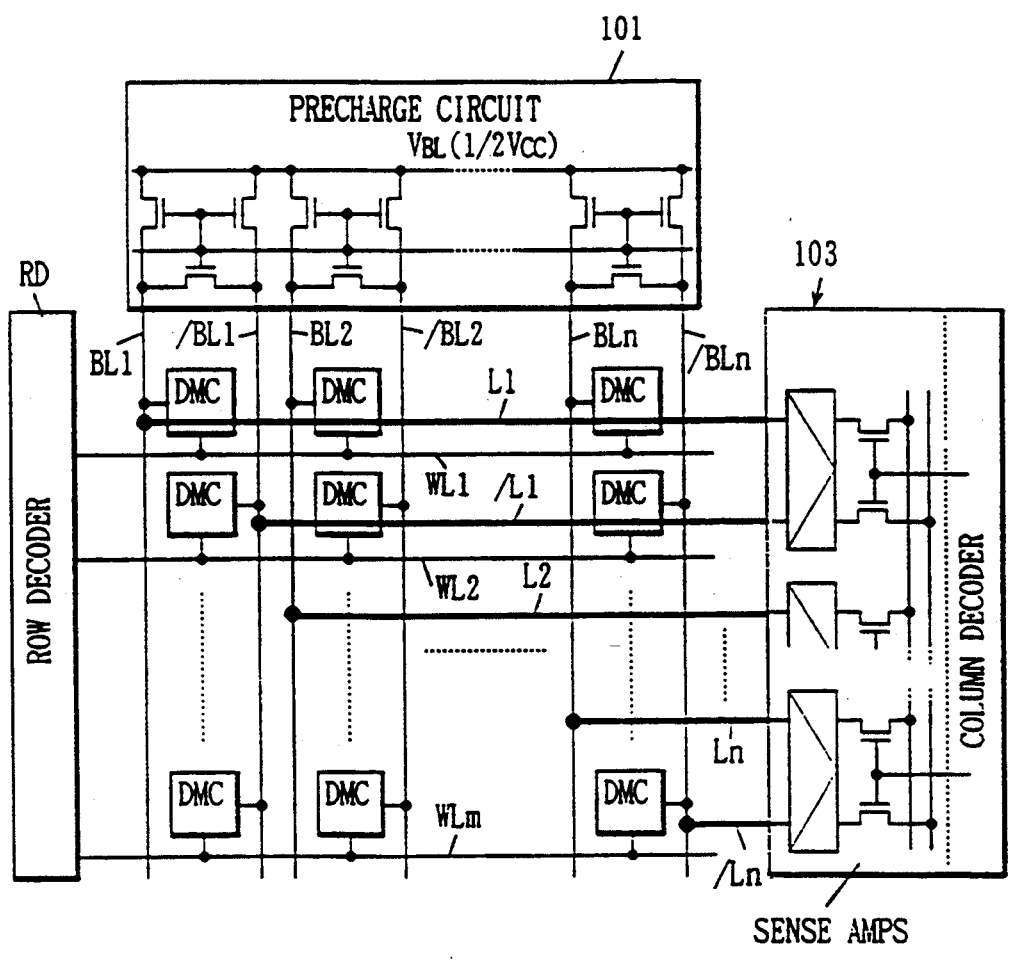
FIG. 44 is a diagram showing a more specific embodiment in more detail of the embodiment shown in FIG. 43.
Figure 45:
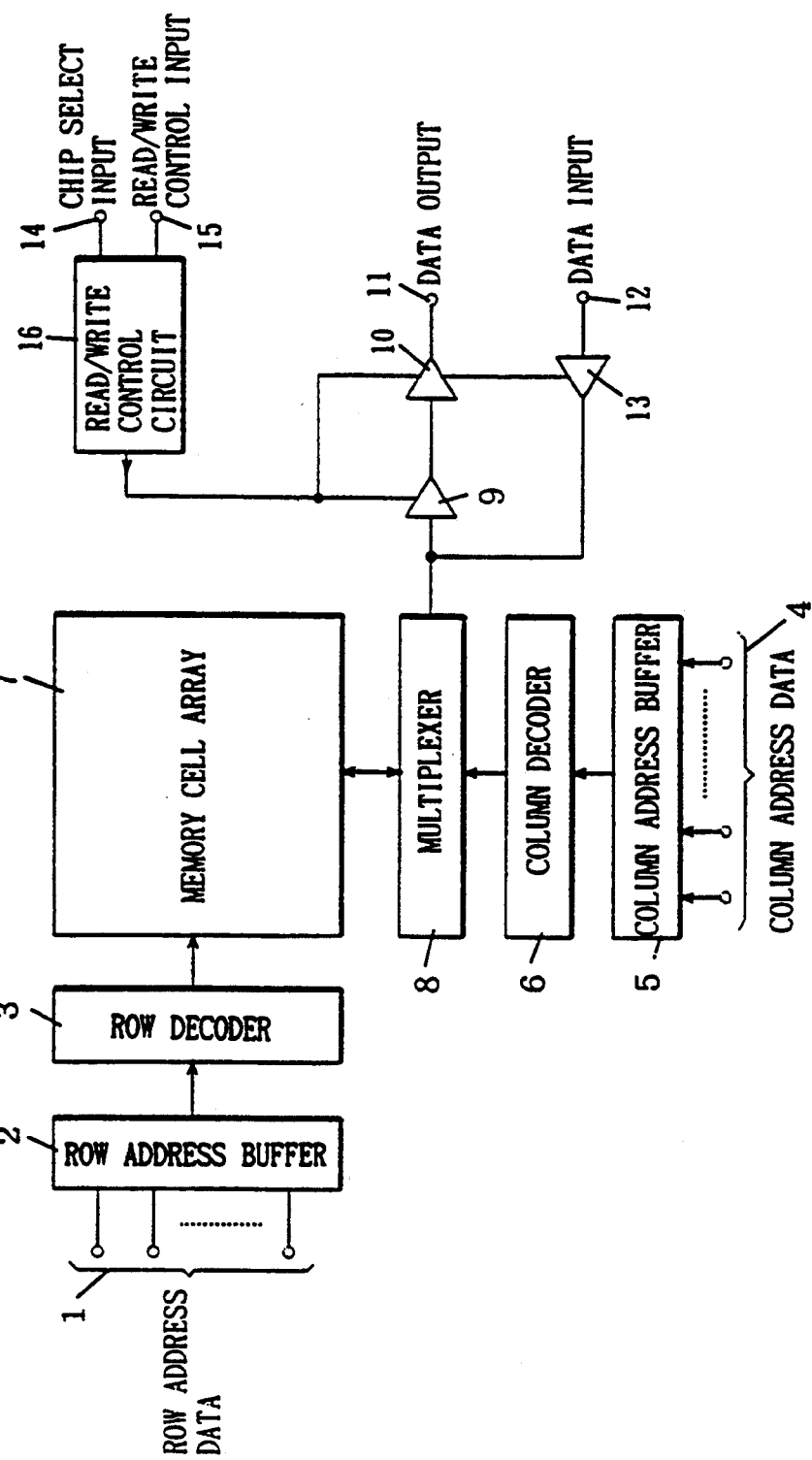
FIG. 45 is a block diagram showing a structure of a conventional SRAM.
Figure 46:
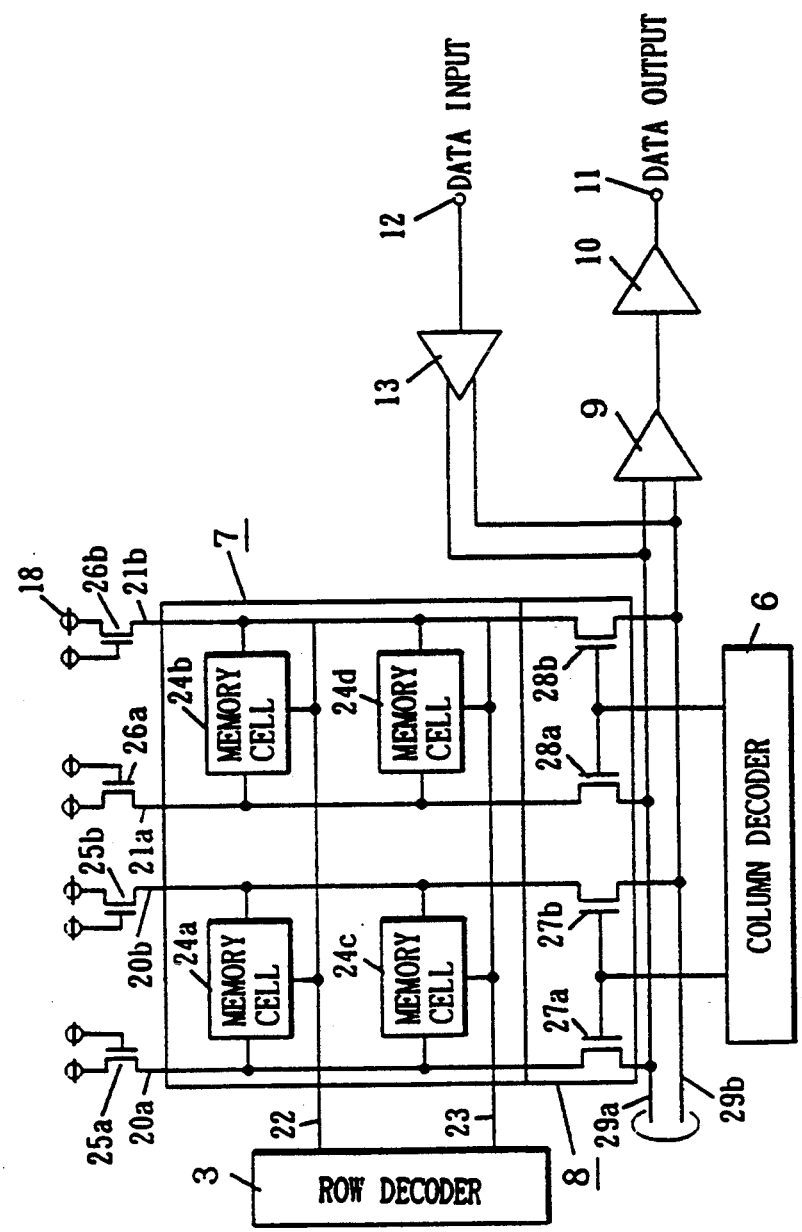
FIG. 46 shows a structure of a peripheral portion of the memory cell array of the SRAM shown in FIG. 45.

FIG. 44 shows a specific, more detailed example of the embodiment of FIG. 43.

As shown in FIGS. 41 and 43, the present invention may be applied to the DRAMs so as to achieve the same effect as that in the SRAMs. Although the DRAM in FIGS. 41 and 43 is illustrated to have structures corresponding to those in the first embodiment in FIG. 1, other structures same as or similar to those in the 2nd–1-6ith embodiments may be implemented by the DRAMs.

According to the invention, as described hereinabove, the bit line signal IO lines provided in the device allow the arrangement of the bit line peripheral circuits at portions or positions at which they could not be arranged in the prior art. Consequently, the bit line peripheral circuits can be dispersedly arranged in the wider space, which allows the arrangement of the bit line peripheral circuits having the large scales or structures without increasing the sizes of the memory cell arrays.

Further, since the corresponding bit lines in the memory cell arrays are connected to each other by the bit line signal IO lines, the bit line peripheral circuit(s) provided for one memory cell array can be commonly used by the other memory cell arrays, so that the number of the bit line peripheral circuits which can be used in each memory cell array can be increased. Therefore, the bit line peripheral circuits having the large structures can be arranged without increasing the sizes of the memory cell arrays.

Since the bit line peripheral circuits and the IO means are connected together by the IO lines passing over the memory cell arrays, according to the invention, wiring spaces for the IO lines, which have been arranged outside the memory cell arrays in the prior art, can be reduced, resulting in reduction of the chip sizes.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a plurality of first bit lines arranged in a first direction, each of said plurality of first bit lines being connected to a plurality of memory cells;

a plurality of second bit lines respectively provided corresponding to said plurality of first bit lines and arranged in a second direction perpendicular to said first direction, said plurality of second bit lines being connected to respective said first bit lines through common connection nodes;

bit line charging means which is provided on at least one end side of said plurality of first bit lines, for precharging said first bit lines and said second bit lines to a predetermined potential; and read out means which is arranged on at least one end side of said plurality of second bit lines, for receiving data from said memory cells through said first bit lines and said second bit lines, and for outputting the data.

2. A semiconductor memory device according to claim 1, wherein said memory cells are static memory cells.

3. A semiconductor memory device according to claim 1, wherein:
said read out means includes a sense amplifier for amplifying data from said memory cell.

4. A semiconductor memory device according to claim 1, wherein:
said read out means includes IO lines, and
a multiplexer for selectively connecting said second bit lines to said IO lines.

5. A semiconductor memory device according to claim 1, further comprising:
a column decoder arranged on one ends of said second bit lines on the same side as said read out means.

6. A semiconductor memory device according to claim 1, further comprising:
data write means placed on one ends of said second bit lines on the same side as said read out means, for writing data to said memory cells through said second bit lines and said first bit lines.

7. A semiconductor memory device, comprising:
a plurality of first bit lines arranged in a plurality of columns, to each of which a plurality of memory cells are connected;
a plurality of second bit lines arranged crossing said first bit lines, each provided corresponding to each said first bit line and connected to the corresponding first bit line through a common connection node;
bit line loading means connecting to said first bit lines for precharging said first and second bit lines to a prescribed potential; and
a sense amplifier connected to said second bit lines, and receiving data from said memory cells through said first and second bit lines for amplifying the data.

8. A semiconductor memory device according to claim 7, wherein:
said memory cells are static memory cells.

9. A semiconductor memory device according to claim 7, wherein:
said first bit lines are formed in a first layer, said second bit lines are formed in a second layer, and said second layer is upper than said first layer.

10. A semiconductor memory device according to claim 7, wherein:
said first bit lines cross said second bit lines substantially orthogonally.

11. A semiconductor memory device, comprising:

a plurality of first bit lines arranged in a first direction, each of said plurality of first bit lines being connected to a plurality of memory cells;

a plurality of second bit lines respectively provided corresponding to said plurality of first bit lines and arranged in a second direction perpendicular to said first direction, each of said plurality of second bit lines being connected to corresponding one of said first bit lines though a common connection node;

bit line load means provided on at least one of both end sides of said plurality of second bit lines, for precharging said first bit lines and said second bit lines to a predetermined potential; and data outputting means arranged on at least one of both end sides of said plurality of second bit lines, for receiving data from said memory cells through said first bit lines and said second bit lines, and for outputting said data.

12. A semiconductor memory device according to claim 11, wherein said memory cells are static memory cells.

13. A semiconductor memory device according to claim 11, wherein:
said data outputting means includes a sense amplifier for amplifying data from said memory cells.

14. A semiconductor memory device according to claim 11, wherein:
said data outputting means includes IO lines, and a multiplexer for selectively connecting said second bit lines to said IO lines.

15. A semiconductor memory device according to claim 11, further comprising:
a column decoder arranged on one end of said second bit lines on the same side as said data outputting means.

16. A semiconductor memory device according to claim 11, further comprising:
data write means arranged on one end of said second bit lines on the same side as said data outputting means for writing data through said second bit lines and said first bit lines to said memory cells.

17. A semiconductor memory device according to claim 11, wherein:
each of said first bit lines is directly connected to said memory cells and corresponding one of said second bit lines.

18. A semiconductor memory device according to claim 17, wherein:
said memory cells are static memory cells.

19. A semiconductor memory device according to claim 17, wherein:
said data outputting means includes a sense amplifier for amplifying data from said memory cells.

20. A semiconductor memory device according to claim 17, wherein
said data outputting means includes IO lines, and a multiplexer for selectively connecting said second bit lines to said IO lines.

21. A semiconductor memory device according to claim 17, further comprising:
a column decoder arranged on one end on the same side as said data outputting means of said second bit lines.

22. A semiconductor memory device according to claim 17, further comprising:
data write means arranged on one end of said second bit lines on the same side as said data outputting means for writing data through said second bit lines and said first bit lines to said memory cells.

23. A semiconductor memory device, comprising:
a plurality of memory cell arrays each including a plurality of first bit lines arranged in a first direction, to each of which a plurality of memory cells are connected, and a plurality of second bit lines arranged corresponding to said first bit lines in a second direction perpendicular to said first direction and connected to a corresponding one of said first bit lines through a common connection node;
a plurality of read out means each corresponding to each said memory cell array, arranged on an end in said second direction of the corresponding memory cell array, and receiving data from memory cells of the corresponding memory cell array through said first and second bit lines for providing the data; and
an output line provided commonly to said plurality of read out means, to which data from said plurality of read out means is selectively transmitted.

24. A semiconductor memory device according to claim 23, wherein:
said output line is arranged across said plurality of memory arrays.

25. A semiconductor memory device including a plurality of semiconductor memory devices as defined by claim 23 arranged in a said first direction.

* * * * *